US007929581B2

(12) United States Patent
Ishikawa et al.

(10) Patent No.: US 7,929,581 B2
(45) Date of Patent: Apr. 19, 2011

(54) TESTING METHOD OF WAVELENGTH-TUNABLE LASER, CONTROLLING METHOD OF WAVELENGTH-TUNABLE LASER AND LASER DEVICE

(75) Inventors: Tsutomu Ishikawa, Yamanashi (JP); Toyotoshi Machida, Yamanashi (JP); Hirokazu Tanaka, Yamanashi (JP)

(73) Assignee: Eudyna Devices Inc., Nakakoma-gun, Yamanashi (JP)

( * ) Notice: Subject to any disclaimer, the term of this patent is extended or adjusted under 35 U.S.C. 154(b) by 92 days.

(21) Appl. No.: 12/342,869

(22) Filed: Dec. 23, 2008

(65) Prior Publication Data

US 2009/0168817 A1 Jul. 2, 2009

(30) Foreign Application Priority Data

Dec. 28, 2007 (JP) ................................ 2007-339196
Dec. 3, 2008 (JP) ................................ 2008-308984

(51) Int. Cl.
*H01S 3/10* (2006.01)
*H01S 3/13* (2006.01)

(52) U.S. Cl. ...................................... 372/20; 372/29.02

(58) Field of Classification Search .................... 372/20, 372/29.02, 92, 99
See application file for complete search history.

(56) References Cited

U.S. PATENT DOCUMENTS

| | | | | |
|---|---|---|---|---|
| 5,642,371 | A * | 6/1997 | Tohyama et al. | 372/45.01 |
| 2003/0147442 | A1 * | 8/2003 | Larson et al. | 372/50 |
| 2004/0008743 | A1 * | 1/2004 | Nishimura et al. | 372/32 |
| 2005/0254531 | A1 | 11/2005 | Furukawa et al. | |
| 2007/0258494 | A1 * | 11/2007 | Davies et al. | 372/20 |

FOREIGN PATENT DOCUMENTS

JP 2004-047638 A 2/2004

OTHER PUBLICATIONS

Chinese Office Action dated Mar. 10, 2010, issued in corresponding Chinese Patent Application No. 200810185043.6.

* cited by examiner

*Primary Examiner* — Minsun Harvey
*Assistant Examiner* — Phillip Nguyen
(74) *Attorney, Agent, or Firm* — Westerman, Hattori, Daniels & Adrian, LLP

(57) ABSTRACT

A testing method of a wavelength-tunable laser having a resonator including wavelength selection portions having wavelength property different from each other includes a first step of controlling the wavelength-tunable laser so as to oscillate at a given wavelength according to an initial setting value, a second step of tuning the wavelength property of the wavelength selection portions and detecting discontinuity point of gain-condition-changing of the wavelength-tunable laser, and a third step of obtaining a stable operating point of the wavelength selection portion according to a limiting point of an oscillation condition at the given wavelength, the limiting point being a point when the discontinuity point is detected.

8 Claims, 22 Drawing Sheets

FIG. 3

| | INITIAL SETTING VALUE | | | | | | FEEDBACK CONTROL TARGET VALUE | | | | |
|---|---|---|---|---|---|---|---|---|---|---|---|
| Ch | $I_{LD}$[mA] | $I_{SOA}$ [mA] | $I_{a\ Heater}$ [mA] | $I_{b\ Heater}$ [mA] | $I_{c\ Heater}$ [mA] | $T_{LD}$ [deg. C] | Im1 [mA] | Im3/Im2 | $Pa_{Heater}$ [mW] | $Pb_{Heater}$ [mW] | $Pc_{Heater}$ [mW] |
| 1 | 100 | 51.0 | 31.8 | 20.5 | 12.0 | 21.23 | 2.23 | 1.50 | 104.18 | 43.2 | 15.6 |
| 2 | 100 | 49.0 | 32.1 | 25.3 | 16.7 | 30.52 | 2.70 | 1.23 | 106.20 | 65.0 | 27.2 |
| 3 | 100 | 48.5 | 34.2 | 32.2 | 30.8 | 32.54 | 1.85 | 1.45 | 121.47 | 105.6 | 93.0 |
| ⋮ | ⋮ | ⋮ | ⋮ | ⋮ | ⋮ | ⋮ | ⋮ | ⋮ | ⋮ | ⋮ | ⋮ |
| n | 100 | 50.0 | 32.2 | 37.5 | 45.6 | 33.33 | 2.14 | 1.41 | 106.95 | 140.6 | 207.0 |

FIG. 22

| | OPTIMAL SETTING VALUE | | |
|---|---|---|---|
| Ch | $Pa_{Heater-x}$ [w] | $Pb_{Heater-x}$ [w] | $Pc_{Heater-x}$ [w] |
| 1 | ○○ | ○○ | ○○ |
| 2 | ○○ | ○○ | ○○ |
| ⋮ | ⋮ | ⋮ | ⋮ |
| N | ○○ | ○○ | ○○ |

TESTING METHOD OF WAVELENGTH-TUNABLE LASER, CONTROLLING METHOD OF WAVELENGTH-TUNABLE LASER AND LASER DEVICE

BACKGROUND OF THE INVENTION

1. Field of the Invention

The present invention relates a testing method of a wavelength-tunable laser, a controlling method of wavelength-tunable laser and a laser device.

2. Description of the Related Art

A tunable laser that can select a desirable oscillation wavelength is known. For example, the tunable laser has two or more wavelength selection portions such as a reflector having periodical reflection spectrum or a gain region having periodical gain spectrum. The tunable laser selects the desirable wavelength when a relative relation between the periodical peaks is controlled.

Oscillation condition such as oscillation wavelength or optical spectrum is detected with use of a meter such as wavelength meter or an optical spectrum analyzer; an optimal operating point according to each channel is detected, a wavelength selection information such as a look-up table is set; and setting temperature of a temperature control device (TEC) and setting current of a reflector are obtained based on the wavelength selection information, in order to detect a relative relationship of each periodical peak.

The tunable laser obtains a desirable oscillation wavelength by using the value from the look-up table at starting and wavelength switching. For example, a wavelength detection portion detects an output wavelength of the tunable laser.

The tunable laser tunes the TEC temperature if the detected value is different from a setting value of the look-up table, and corrects a peak of a gain spectrum of the gain region. This feedback loop is generally called as wavelength locker. This operation allows constant output wavelength.

FIG. 1 illustrates a relationship between a heater temperature of a reflector having a periodical reflection spectrum peak and an oscillation wavelength. The tunable laser determines oscillation condition at an overlap between peaks of a reflector having periodical reflection peak and a gain region having periodical gain peak. The tunable laser, therefore, has discontinuous wavelength property. An even terrace portion in FIG. 1 shows a stable oscillation wavelength of the tunable laser. That is, an objective wavelength-tunable laser of the present invention has a discontinuous oscillation condition.

It is necessary to set the heater temperature in a range "A" illustrated in FIG. 1, if a selected wavelength is "λ2". A look-up table stores heater current corresponding to an optimal operating point "a" of a terrace.

Here, the tunable laser can oscillate at an initial wavelength "λ2", if the heater temperature is the optimal operating point "a". The tunable laser may oscillate at a wavelength other than the wavelength "λ2", if a setting value for obtaining the initial wavelength is shifted from the optimal operating point "a" because of degradation of the laser chip and affection of an electrical power supply.

For example, the tunable laser may oscillate at a wavelength other than "λ2", if initial temperature of the temperature control device or initial driving current of the tunable laser is not accurately provided to the tunable laser. That is, there is a problem that the tunable laser tends to be affected by parameter changing.

Japanese Patent Application Publication No. 2004-47638 (hereinafter referred to as Document 1) discloses a method of detecting a mode skipping with use of a wavelength detector or an oscillation mode detector, as a method solving the problem. In Document 1, a wavelength detector detects oscillation condition such as the oscillation wavelength or optical spectrum. The wavelength detector is structured with an etalon having periodical peak. A parameter for controlling a position relationship of the periodical peak is increased and decreased, and a boundary A1 and a boundary A2 are detected around a large shift point of wavelength, with use of the wavelength detector. An average between the boundary A1 and the boundary A2 is set to be the optimal operating point "a", and the initial value is shifted. In this case, the position relationship of the periodical peak may be controlled optimally, even if the initial temperature of the temperature control device or the driving current of the tunable laser is not accurately provided to the tunable laser. Therefore, a possibility of oscillation at another wavelength may be reduced.

There is, however, a case where the wavelength detector cannot detect the large shift of wavelength, because of wavelength interval of the wavelength skipping, with the method disclosed in Document 1. For example, detection result is possibly the same around the large shift of wavelength, when the wavelength mode skips at the same period as that of the wavelength detector. In this case, it is difficult to detect the boundary A1 and the boundary A2. In Document 1, a plurality of etalons having different wavelength range are combined in order to solve the problem. In this case, cost may be increased and downsizing is difficult because of enlargement of component count and assembling hour.

SUMMARY OF THE INVENTION

The present invention has been made in view of the above circumstances and provides a testing method of a wavelength-tunable laser, a controlling method of a wavelength-tunable laser and a laser device that restrain enlargement of component count and assembling hour and detect an optimal operating point.

According to an aspect of the present invention, there is provided a testing method of a wavelength-tunable laser having a resonator including wavelength selection portions having wavelength property different from each other, including a first step of controlling the wavelength-tunable laser so as to oscillate at a given wavelength according to an initial setting value, a second step of tuning the wavelength property of the wavelength selection portions and detecting discontinuity point of gain-condition-changing of the wavelength-tunable laser, and a third step of obtaining a stable operating point of the wavelength selection portion according to a limiting point of an oscillation condition at the given wavelength, the limiting point being a point when the discontinuity point is detected.

With the method, the stable operating point of wavelength selection property may be determined without a combination of etalons having different wavelength range, because the discontinuity of the gain condition is detected. It is therefore possible to restrain enlargement of component count and assembling hour. This results in restraint of increase in cost and growth in size.

According to another aspect of the present invention, there is provided a controlling method of a wavelength-tunable laser having a resonator including wavelength selection portions having wavelength property different from each other, including: a first step of controlling the wavelength-tunable laser so as to oscillate at a given wavelength according to an initial setting value; a second step of tuning the wavelength property of the wavelength selection portions and detecting discontinuity point of gain-condition-changing of the wavelength-tunable laser; a third step of obtaining a stable operating point of the wavelength selection portion according to a limiting point of an oscillation condition at the given wavelength, the limiting point being a point when the discontinuity point is detected; and controlling the wavelength-tunable laser so as to oscillate at the stable operating point obtained in the third step as a target value.

With the method, the stable operating point of wavelength selection property may be determined without a combination of etalons having different wavelength range, because the discontinuity of the gain condition is detected. It is therefore possible to restrain enlargement of component count and assembling hour. This results in restraint of increase in cost and growth in size.

According to another aspect of the present invention, there is provided a laser device including: a wavelength-tunable laser having a resonator including wavelength selection portions having wavelength property different from each other; a discontinuity-point detector that controls the wavelength-tunable laser so as to oscillate at a given wavelength according to an initial setting value, tunes the wavelength property of the wavelength selection portions, and detects discontinuity point of gain condition changing of the wavelength-tunable laser; an operating-point calculator that obtains a stable operating point of the wavelength selection portion according to a limiting point of an oscillation condition at the given wavelength, the limiting point being a point when the discontinuity point is detected; and a controller that controls the wavelength-tunable laser so as to oscillate at the stable operating point obtained in the third step as a target value.

With the structure, the stable operating point of wavelength selection property may be determined without a combination of etalons having different wavelength range, because the discontinuity of the gain condition is detected. It is therefore possible to restrain enlargement of component count and assembling hour. This results in restraint of increase in cost and growth in size.

BRIEF DESCRIPTION OF THE DRAWINGS

Other objects, features and advantages of the present invention will become more apparent from the following detailed description when read in conjunction with the accompanying drawings, in which:

FIG. 3 illustrates an example of a look-up table;

FIG. 22 illustrates an optimal target value of a control of electrical power provided to the heater.

DESCRIPTION OF THE PREFERRED EMBODIMENTS

A description will now be given of embodiments of the present invention with reference to the accompanying drawings.

First Embodiment

Figure 2:
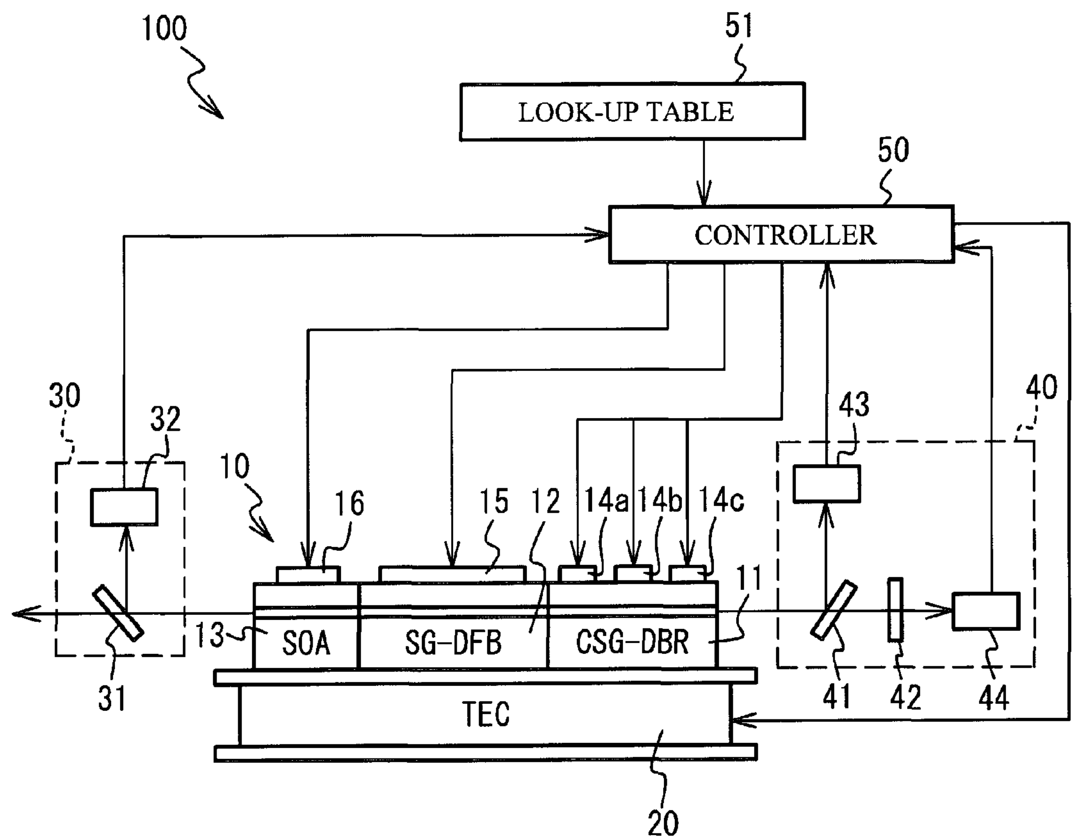
FIG. 2 illustrates a schematic view of a wavelength-tunable laser in accordance with a first embodiment and a laser device having the wavelength-tunable laser.

FIG. 2 illustrates a schematic view of a wavelength-tunable laser 10 in accordance with a first embodiment and a laser device 100 having the wavelength-tunable laser 10. As illustrated in FIG. 2, the laser device 100 has the wavelength-tunable laser 10, a temperature control device 20, an output detector 30, a wavelength detector 40 and a controller 50. The wavelength-tunable laser 10 is on the temperature control device 20. A description will be given of details of each component.

The wavelength-tunable laser 10 has a structure in which a Chirped Sampled Grating Distributed Reflector (CSG-DR) region 11, a Sampled Grating Distributed Feedback Laser (SG-DFB) region 12 and a Semiconductor Optical Amplifier (SOA) region 13 are coupled in order.

The CSG-DBR region 11 has an optical waveguide having segments in which a first region having a diffraction grating and a second region coupled to the first region and acting as a spacer are provided. In the embodiment, three segments are provided in the optical waveguide, as an example. The optical waveguide is made of semiconductor crystalline having an absorption edge wavelength at shorter wavelengths side compared to the laser oscillation wavelength. Each second region has a different length, in the CSG-DBR region 11. There are provided three heaters 14_a_ through 14_c_ on the CSG-DBR region 11 above the segments respectively.

The SG-DFB region 12 has an optical waveguide having segments in which a first region having a diffraction grating and a second region coupled to the first region and acting as a spacer. The optical waveguide is made of semiconductor crystalline amplifying a light of a desirable wavelength of a laser oscillation. Each second region has the same length in the SG-DFB region 12. An electrode 15 is provided on the SG-DFB region 12.

A period of wavelength peak of the CSG-DBR region 11 is different from that of the SG-DFB region 12. The CSG-DBR region 11 and the SG-DFB region 12 act as a wavelength selection portion. A vernier effect is obtained when wavelength property of the CSG-DBR region 11 and the SG-DFB region 12 is tuned. This results in a selection of oscillation wavelength.

The SOA region 13 has an optical waveguide made of semiconductor crystalline that amplifies a light or absorbs light with current control or voltage control. An electrode 16 is provided on the SOA region 13. Each optical waveguide of the CSG-DBR region 11, the SG-DFB region 12 and the SOA region 13 is optically connected to each other.

The wavelength-tunable laser 10 is mounted on the temperature control device 20. A thermistor for measuring temperature of the temperature control device 20 is mounted on the temperature control device 20.

The output detector 30 includes a beam splitter 31 and a photo diode 32. The beam splitter 31 is arranged so that a part of a laser light passing through the SOA region 13 is reflected and the reflected laser light is given to the photo diode 32. The wavelength detector 40 has a beam splitter 41, an etalon 42 and photo diodes 43 and 44. The beam splitter 41 is arranged so that a part of a laser light output from the CSG-DBR region 11 side is reflected, the reflected laser light is given to the photo diode 43, and the rest of the laser light passes through the beam splitter 41 and is given into the photo diode 44. The etalon 42 is arranged between the beam splitter 41 and the photo diode 44.

In FIG. 2, the wavelength detector 40 is arranged on the CSG-DBR region 11 side, and the output detector 30 is arranged on the SOA region 13 side. The structure is not limited to the above one. For example, each detector is arranged adversely.

The controller 50 has an electrical power supply and a control portion such as a central processing unit (CPU), a random access memory (RAM), a read only memory (ROM). The ROM of the controller 50 stores control information, a control program and so on of the wavelength-tunable laser 10. A look-up table 51 stores the control information. FIG. 3 illustrates an example of the look-up table 51.

As illustrated in FIG. 3, the look-up table 51 includes initial setting value and feedback control target value at every channel. The initial setting value includes initial current $I_{LD}$ of the SG-DFB region 12, initial current $I_{SOA}$ of the SOA region 13, initial current $Ia_{Heater}$ through $Ic_{Heater}$, and initial temperature $T_{LD}$ of the temperature control device 20. The feedback control target value includes feed back control target value 1 ml of the output detector 30, feedback control target value Im3/Im2 of the wavelength detector 40, and feedback control target value $Pa_{Heater}$ through $Pc_{Heater}$ of electrical power provided to the heaters 14*a* through 14*c*. The feedback control target value 1 ml indicates a target detection value of the photo diode 32. The feedback control target value Im3/Im2 indicates a target value in which the detected value of the photo diode 44 is divided by the detected value of the photo diode 43.

Next, a description will be given of an operation of the laser device 100 at starting (cold starting). The operation (cold start) is performed in a condition (dark tuning) where the SOA region 13 is used as a shutter and a laser light is not output from the laser device 100. The controller 50 refers to the look-up table 51, and obtains the initial current $I_{LD}$, the initial current $I_{SOA}$, the initial current $Ia_{Heater}$ through $Ic_{Heater}$ and the initial temperature $T_{LD}$ of setting channel.

Next, the controller 50 controls the temperature control device 20 so that the temperature of the temperature control device 20 is tuned to the initial temperature $T_{LD}$. Thus, the temperature of the wavelength-tunable laser 10 is controlled to be constant value around the initial temperature $T_{LD}$. And the equivalent refractive index of the optical waveguide in the SG-DFB region 12 is controlled. Next, the controller 50 provides current of the initial current $I_{LD}$ to the electrode 15. This results in generation of a light in the optical waveguide in the SG-DFB region 12. The light generated in the SG-DFB region 12 propagates in the optical waveguides of the CSG-DBR region 11 and the SG-DFB region 12, is reflected and amplified repeatedly, and oscillates.

Next, the controller 50 provides current of the initial current $Ia_{Heater}$ through $Ic_{Heater}$ to the heaters 14*a* through 14*c* respectively. Thus, the equivalent refraction index of the optical waveguide of the CSG-DBR region 11 is controlled to be a given value. Then, the controller 50 provides current of the initial current $I_{SOA}$ to the electrode 16. With the controls, the wavelength-tunable laser 10 emits a laser light at initial wavelength according to the setting channel.

Then, the controller 50 optimizes the electrical power provided to the heaters 14*a* through 14*c*. This optimization control is described later. After that, the controller 50 controls the current or the voltage provided to the SOA region 13 in feedback so that the detection result of the photo diode 32 is tuned to the feedback control target value 1 ml. It is therefore possible to control the intensity of the laser light in a predetermined range.

Next, the controller 50 controls the temperature of the temperature control device 20 in feedback so that the detection result of the photo diode 44 divided by the detection result of the photo diode 43 is tuned to the feedback control target value Im3/Im2. It is therefore possible to control the oscillation wavelength in a predetermined range. Further, the controller 50 controls the electrical power provided to the heaters 14*a* through 14*c* to be the feedback control target values $Pa_{Heater}$ through $Pc_{Heater}$ respectively in feedback. With the controls, the wavelength-tunable laser 10 oscillates at a desirable wavelength.

The electrical power provided to the heaters 14*a* through 14*c* may be optimized while the current or the voltage provided to the SOA region 13 is controlled in feedback so that the detection result of the photo diode 32 is tuned to the feedback control target value 1 ml. Alternatively, the above-mentioned optimization may be performed while a constant voltage is implied to the SOA region 13 and a light is absorbed in the SOA region 13. In this case, it is possible to detect the intensity of the laser light at front edge face with use of the SOA region 13.

A description will be given of an optimization of the electrical power provided to the heaters 14*a* through 14*c* at the starting.

Figure 1:
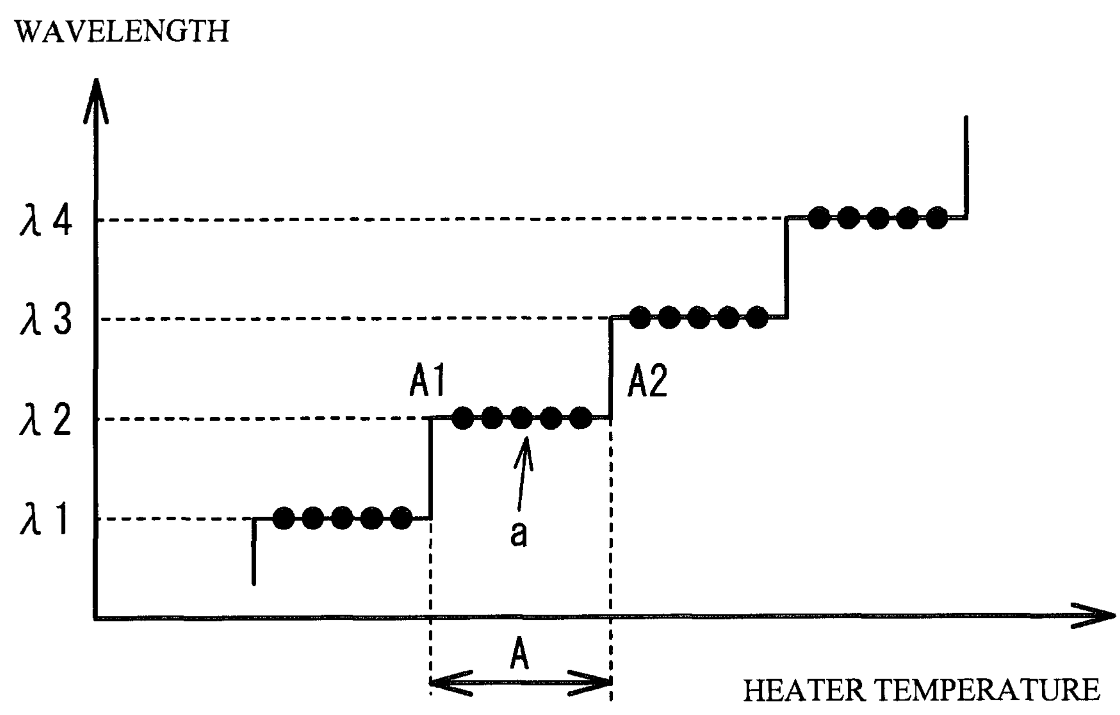
FIG. 1 illustrates a relationship between heater temperature of a reflector having a periodical reflection spectrum and an oscillation wavelength.

It is necessary to determine an optimal operating point "a" in FIG. 1 and to control the heater temperature to be the optimal point "a" for the purpose of optimization control. Here, it is necessary to determine a boundary A1 and a boundary A2 in order to determine the optimal operating point "a". And it is necessary to shift an operating point to the optimal operating point "a" actually. It is necessary to control of shifting only operating point without changing of the oscillation wavelength (for example X2) in order to shift the operating point to the optimal operating point "a".

Three heaters 14*a* through 14*c* are provided on the CSG-DBR region 11 illustrated in FIG. 2. Oscillation wavelength is obtained with a control of a temperature of the heaters and average of the temperature of each heater. It is, however, necessary to tune the average of the heater temperature with the relationship between each heater temperature being fixed, in order to tune only the operating point with the oscillation wavelength being fixed. Hereinafter, the relationship between each heater temperature is fixed during the tuning of the average temperature T.

(A Case of Using Laser Light Intensity from a Back Edge)

Figure 4A:
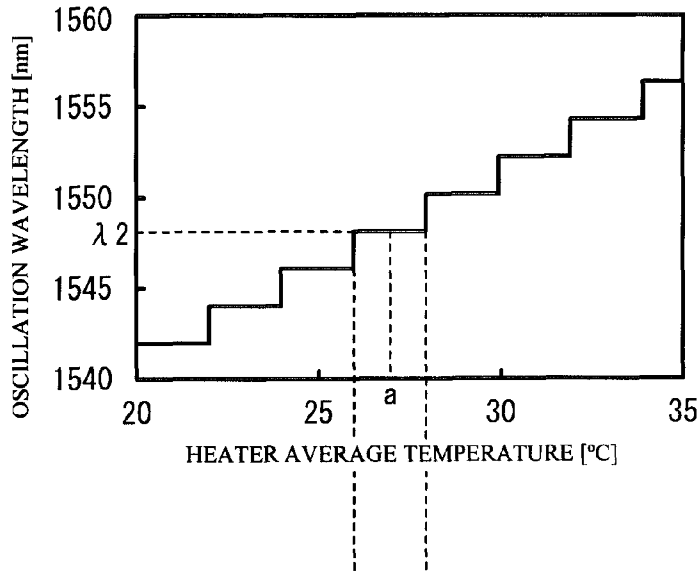
FIG. 4A through FIG. 4C illustrate a relationship between the heater temperature and laser light intensity from a back edge.
Figure 4B:
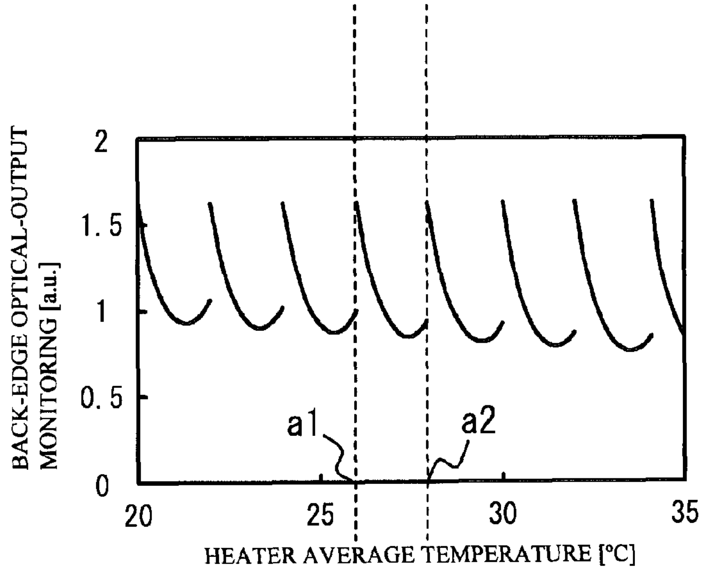

The controller 50 changes the average temperature T of the heaters 14*a* through 14*c*. FIG. 4A illustrates a relationship between the average temperature T and the oscillation wavelength. FIG. 4B illustrates a relationship between the average temperature T and the intensity of the laser light from the CSG-DBR region 11 side (back edge side). The photo diode 43 detects the intensity of the laser light from the back edge.

As illustrated in FIG. 4A, the oscillation wavelength skips increasingly as the average temperature T increases. The oscillation wavelength is kept approximately constant until next wavelength. As illustrated in FIG. 4B, the intensity of the laser light curves and projects downward in a temperature range where the oscillation wavelength is kept constant. An initial wavelength is shown as "λ2". An initial value of the average temperature T is shown as "a".

The controller 50 decreases the electrical power provided to the heaters 14*a* through 14*c* gradually, and decreases the average temperature T gradually. In this case, the intensity of the laser light is increased, as illustrated in FIG. 4B. The intensity of the laser light is greatly decreased discontinuously when the average temperature T is decreased further. The average temperature T in this case is a temperature "a1".

Next, the controller 50 increases the average temperature T gradually by increasing the electrical power provided to the heaters 14*a* through 14*c* gradually. In this case, the intensity of the laser light is decreased once and is increased gradually, as illustrated in FIG. 4B. The intensity of the laser light is greatly increased discontinuously when the average temperature T is increased further. The average temperature T in this case is shown as a temperature "a2". The controller 50 determines the optimal average temperature T in a temperature range from the temperature "a1" to the temperature "a2". For example, the optimal average temperature T is an average between the temperature "a1" and the temperature "a2".

Figure 4C:
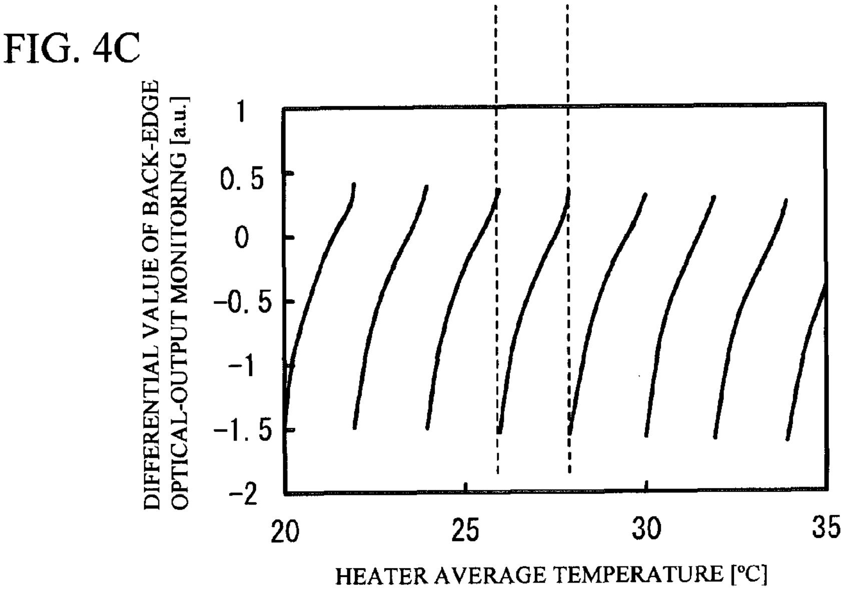

The controller 50 may determine the optimal average temperature T with use of the intensity of the laser light from the back edge differentiated by temperature. FIG. 4C illustrates a relationship between the average temperature T and the intensity of the laser light differentiated by temperature. The differential value of the intensity of the laser light is changed from minus to plus discontinuously, when the average temperature T is decreased further. The average temperature T in this case is a temperature "a1".

On the other hand, the differential value of the intensity of the laser light is increased when the electrical power provided to the heaters 14*a* through 14*c* is increased gradually and the average temperature T is increased. The differential value of the intensity of the laser light is changed from plus to minus discontinuously, when the average temperature T is increased further. The average temperature T in this case is a temperature "a2". The controller 50 determines the optimal average temperature T in a temperature range from the temperature "a1" to the temperature "a2".

It is possible to determine the optimal average temperature of the heaters 14*a* through 14*c* by detecting discontinuity of a gain condition with use of the intensity of the laser light not passing through an etalon. In this case, it is not necessary to combine etalons having different wavelength range. It is therefore possible to restrain enlargement of component count and assembling hour. This results in restraint of increase in cost and growth in size.

(A Case of Using Laser Light Intensity from a Front Edge)

Figure 5A:
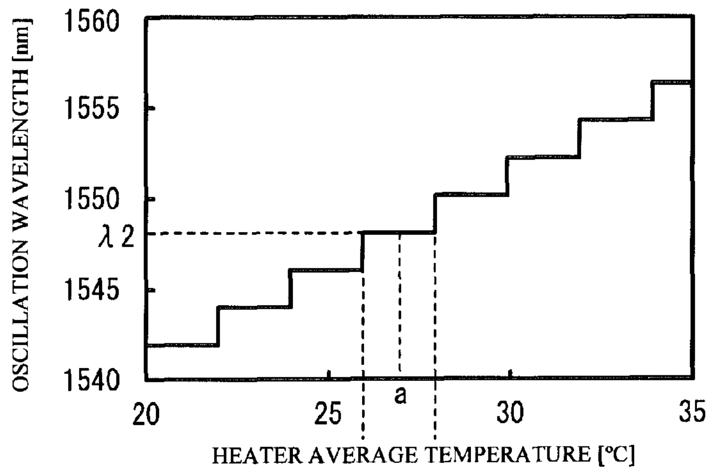
FIG. 5A through FIG. 5C illustrate a relationship between the heater temperature and laser light intensity from a front edge.
Figure 5B:
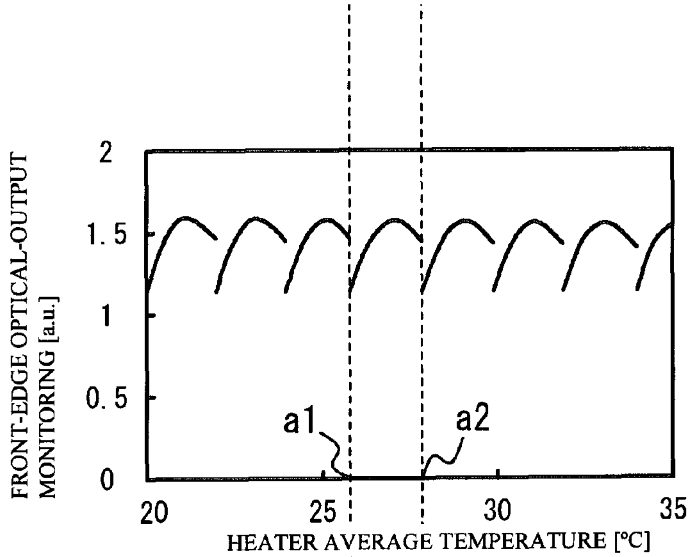

The optimal average temperature T may be determined with use of the intensity of the laser light from the front edge on the SOA region 13 side. FIG. 5A illustrates a relationship between the average temperature T and the oscillation wavelength. FIG. 5B illustrates a relationship between the average temperature T and the intensity of the laser light from the front edge. The intensity of the laser light from the front edge may be detected with the photo diode 32 or the SOA region 13.

The discontinuity of the intensity of the laser light can be detected by detecting the gain condition of the SOA region 13 with the output light from the SOA region 13 being kept constant, in the case of detection with the SOA region 13. In concrete, it is possible to detect the gain condition of the SOA region 13 by detecting the voltage or the current provided to the SOA region 13 with the output light from the SOA region 13 being kept constant.

It is possible to detect the discontinuity of the intensity of the laser light with use of the SOA region 13 as a photo diode. In concrete, it is possible to detect sensing current of the SOA region 13 with the implied voltage to the inversely-biased SOA region 13 being constant. It is possible to detect the sensing current of the SOA region 13 if the SOA region 13 can absorb a light, even if the implied voltage to the SOA region 13 is zero or in forward bias.

As illustrated in FIG. 5B, the intensity of the laser light curves and projects upward in a temperature range where the oscillation wavelength is kept constant. The controller 50 decreases the average temperature T gradually by decreasing the electrical power provided to the heaters 14*a* through 14*c*. In this case, the intensity of the laser light is decreased as illustrated in FIG. 5B. The intensity of the laser light is greatly increased discontinuously when the average temperature T is decreased further. The average temperature in this case is a temperature "a1".

Next, the controller 50 increases the average temperature T gradually by increasing the electrical power provided to the heaters 14*a* through 14*c*. In this case, the intensity of the laser light is increased once and is decreased gradually, as illustrated in FIG. 5B. The intensity of the laser light is greatly decreased discontinuously when the average temperature T is further increased. The average temperature T in this case is a temperature "a2". The controller 50 determines the optimal average temperature T in a temperature range between the temperature "a1" to the temperature "a2".

Figure 5C:
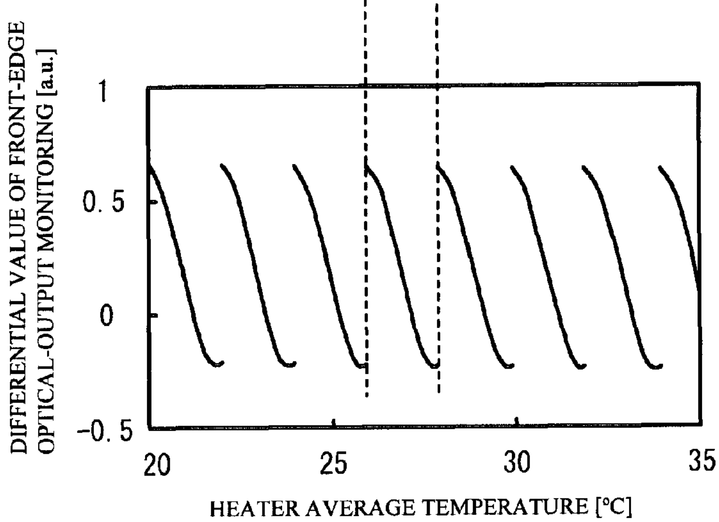

The controller 50 may determine the optimal average temperature T with the laser light intensity from the front edge differentiated by temperature. FIG. 5C illustrates a relationship between the average temperature T and the laser light intensity differentiated by temperature. The differential value of the laser light intensity is changed from plus to minus discontinuously, when the average temperature T is decreased further. The average temperature T is a temperature "a1".

On the other hand, the differential value of the laser light intensity is decreased when the electrical power provided to the heaters 14*a* through 14*c* is increased gradually and the average temperature T is increased. The differential value of the laser light intensity is changed from minus to plus, when the average temperature T is increased further. The average temperature T is a temperature "a2". The controller 50 may determine the optimal average temperature T in a temperature range between the temperature "a1" and the temperature "a2".

It is possible to determine the optimal average temperature of the heaters 14*a* through 14*c* by detecting the discontinuity of the gain condition with use of the differential value of the intensity of the laser light not passing through the etalon. In this case, it is not necessary to combine etalons having different wavelength range. It is therefore possible to restrain enlargement of component count and assembling hour. This results in restraint of increase in cost and growth in size.

The direction toward which the laser light intensity curves in FIG. 4B and FIG. 5B depends on magnitude relation between the sharpness (peak width) of the wavelength peak of the CSG-DBR region 11 and the sharpness (peak width) of the wavelength peak of the SG-DFB region 12.

(A Case of Using Implied Voltage to the SG-DFB Region)

Figure 6A:
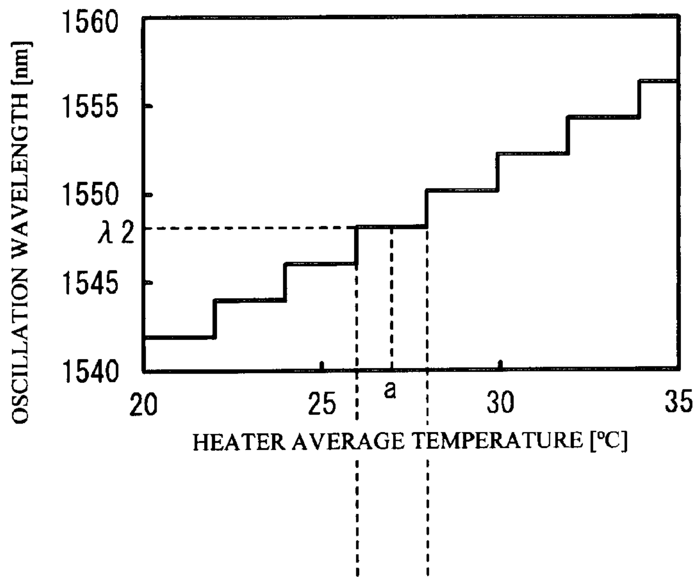
FIG. 6A through FIG. 6C illustrate a relationship between the heater temperature and voltage implied to a DFB region.
Figure 6B:
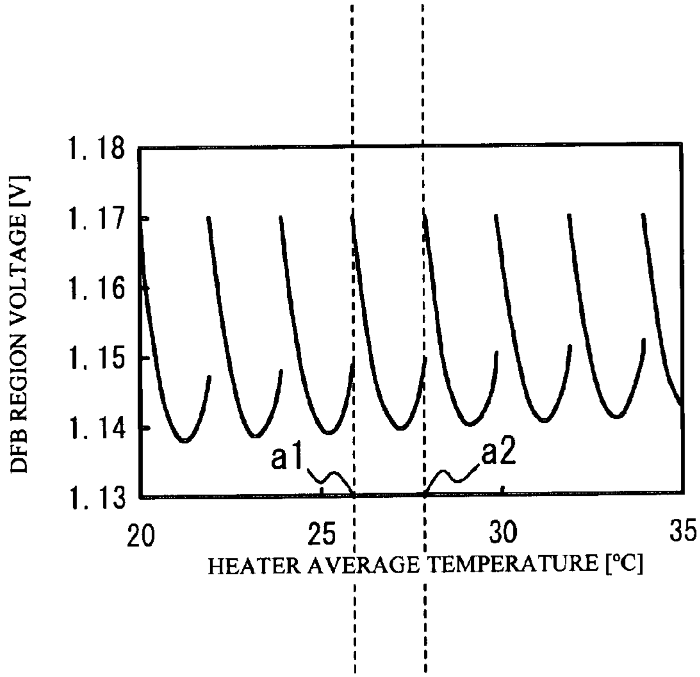

The optimal average temperature T may be determined with use of the voltage implied when the SG-DFB region 12 is operated with a constant current. FIG. 6A illustrates a relationship between the average temperature T and the oscillation wavelength. FIG. 6B illustrates a relationship between the average temperature T and the voltage implied to the SG-DFB region 12. As illustrated in FIG. 6B, the implied voltage curves and projects downward in a temperature range where the oscillation wavelength is kept constant.

The controller 50 decreases the average temperature T gradually by decreasing the electrical power provided to the heaters 14*a* through 14*c* gradually. In this case, as illustrated in FIG. 6B, the voltage implied to the SG-DFB region 12 is increased. The implied voltage is greatly decreased discontinuously when the average temperature T is decreased. The average temperature T is a temperature "a1".

Next, the controller 50 increases the average temperature T gradually by increasing the electrical power provided to the heaters 14*a* through 14*c* gradually. In this case, the implied voltage is decreased once and is increased gradually. The implied voltage is increased discontinuously when the average temperature T is further increased. The average temperature T in this case is a temperature "a2". The controller 50 determines the optimal average temperature T in a temperature range between the temperature "a1" and the temperature "a2".

Figure 6C:
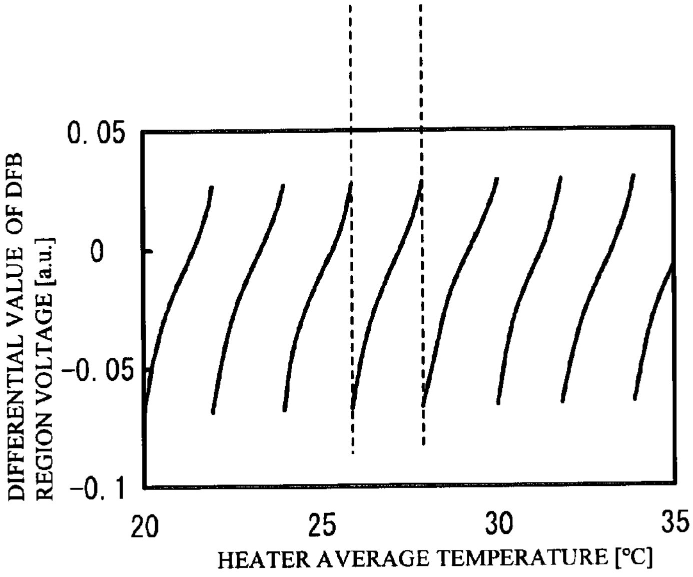

The controller 50 may determine the optimal average temperature T with the implied voltage to the SG-DFB region 12 differentiated by temperature. FIG. 6C illustrates a relationship between the average temperature T and the implied voltage differentiated by temperature. The differential value of the implied voltage is decreased when the electrical power provided to the heaters 14*a* through 14*c* is decreased gradually and the average temperature T is decreased. The differential value of the implied voltage is changed from minus to plus discontinuously, when the average temperature T is decreased. The average temperature T is a temperature "a1".

On the other hand, the differential value of the implied voltage is increased when the electrical power provided to the heaters 14*a* through 14*c* is increased and the average temperature T is increased. The differential value of the implied voltage is changed from plus to minus discontinuously, when the average temperature T is further increased. The average temperature T is a temperature "a2". The controller 50 may determine the optimal average temperature T in a temperature range between the temperature "a1" and the temperature "a2".

The provided current when the SG-DFB region 12 is operated with a constant current may be used instead of the implied voltage when the SG-DFB region 12 is operated with a constant current. The provided current curves and projects upward, although the implied voltage curves and projects downward as illustrated in FIG. 6B. In this case, a discontinuous point is generated in the provided current. It is therefore possible to determine the optimal average temperature T.

It is possible to determine the optimal average temperature of the heaters 14*a* through 14*c*, by detecting the laser light intensity, the voltage implied to the SG-DFB region 12, the current provided to the SG-DFB region 12 and so on, as illustrated in FIG. 4 through FIG. 6.

The feedback control target values $Pa_{Heater}$ through $Pc_{Heater}$ are revised with the electrical power provided the heaters 14*a* through 14*c* that is necessary to determine the optimal average temperature T.

(A Case of Using Current Provided to the CSG-DBR Region)

The equivalent refractive index of the optical waveguide of the CSG-DBR region 11 is tuned by tuning the temperature of the CSG-DBR region 11 in the above-description. However, the equivalent refractive index of the CSG-DBR region 11 may be tuned with the current provided to the CSG-DBR region 11, because carrier density of the optical waveguide is changed with current supply to the CSG-DBR region 11. In this case, it is possible to determine the optimal current provided to the CSG-DBR region 11 by increasing and decreasing the provided current A to the CSG-DBR region 11 and by detecting the discontinuity point of the laser light intensity, the implied voltage or the provided current to the SG-DFB region 12, as in the case of the heating by the heaters.

Figure 7A:
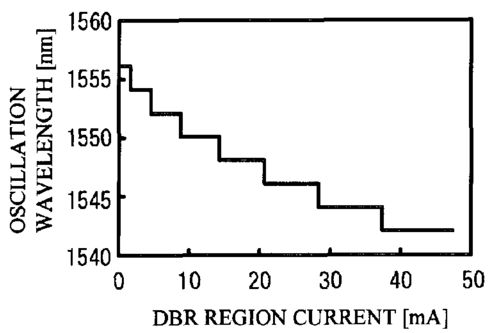
FIG. 7A through FIG. 7G illustrate a relationship between current provided to a DBR region and changing of gain condition.
Figure 7B:
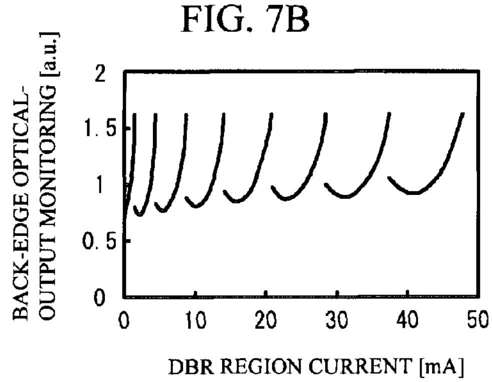
Figure 7C:
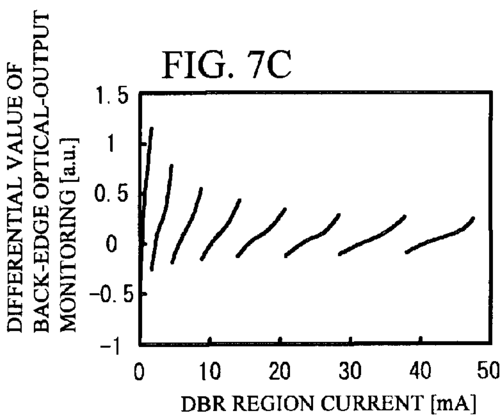
Figure 7D:
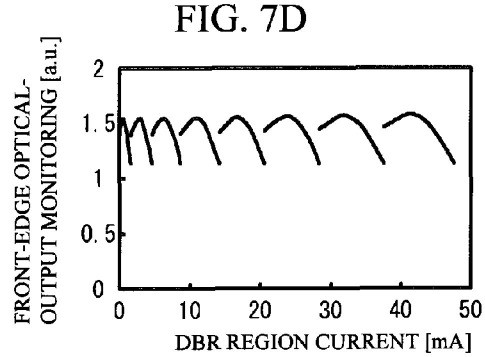
Figure 7E:
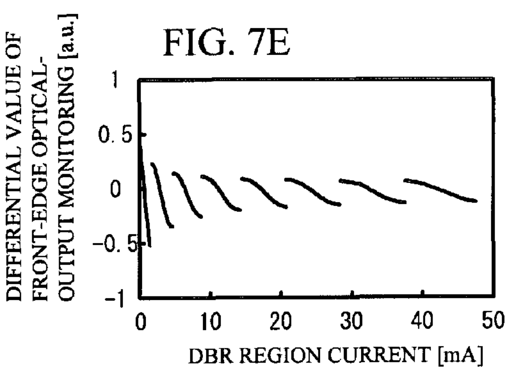
Figure 7F:
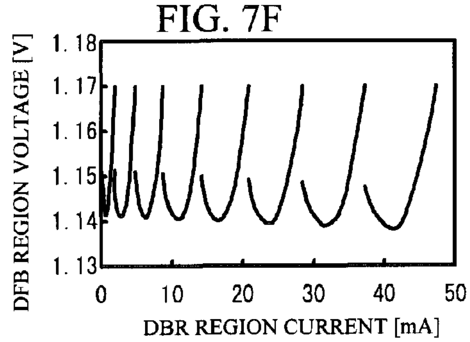
Figure 7G:
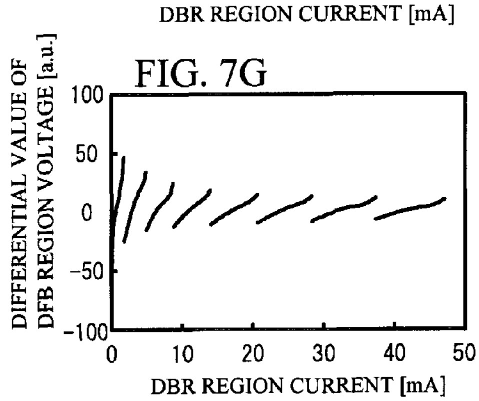

FIG. 7A illustrates a relationship between the provided current A and the oscillation wavelength. FIG. 7B illustrates a relationship between the provided current A and the laser light intensity from the CSG-DBR region 11 side (the back edge side). FIG. 7C illustrates a relationship between the provided current A and the laser light intensity differentiated by temperature. FIG. 7D illustrates a relationship between the provided current A and the laser light intensity from the SG-DFB region 12 side (the front edge side). FIG. 7E illustrates a relationship between the provided current A and the laser light intensity differentiated by temperature. FIG. 7F illustrates a relationship between the provided current A and the voltage implied to the SG-DFB region 12. FIG. 7G illustrates a relationship between the provided current A and the implied voltage to the SG-DFB region 12 differentiated by temperature.

It is possible to determine the optimal current provided to the SG-DFB region 12, by detecting the laser light intensity, the voltage implied to the SG-DFB region 12, the current provided to the SG-DFB region 12 and so on, as illustrated in FIG. 7.

Figure 8:
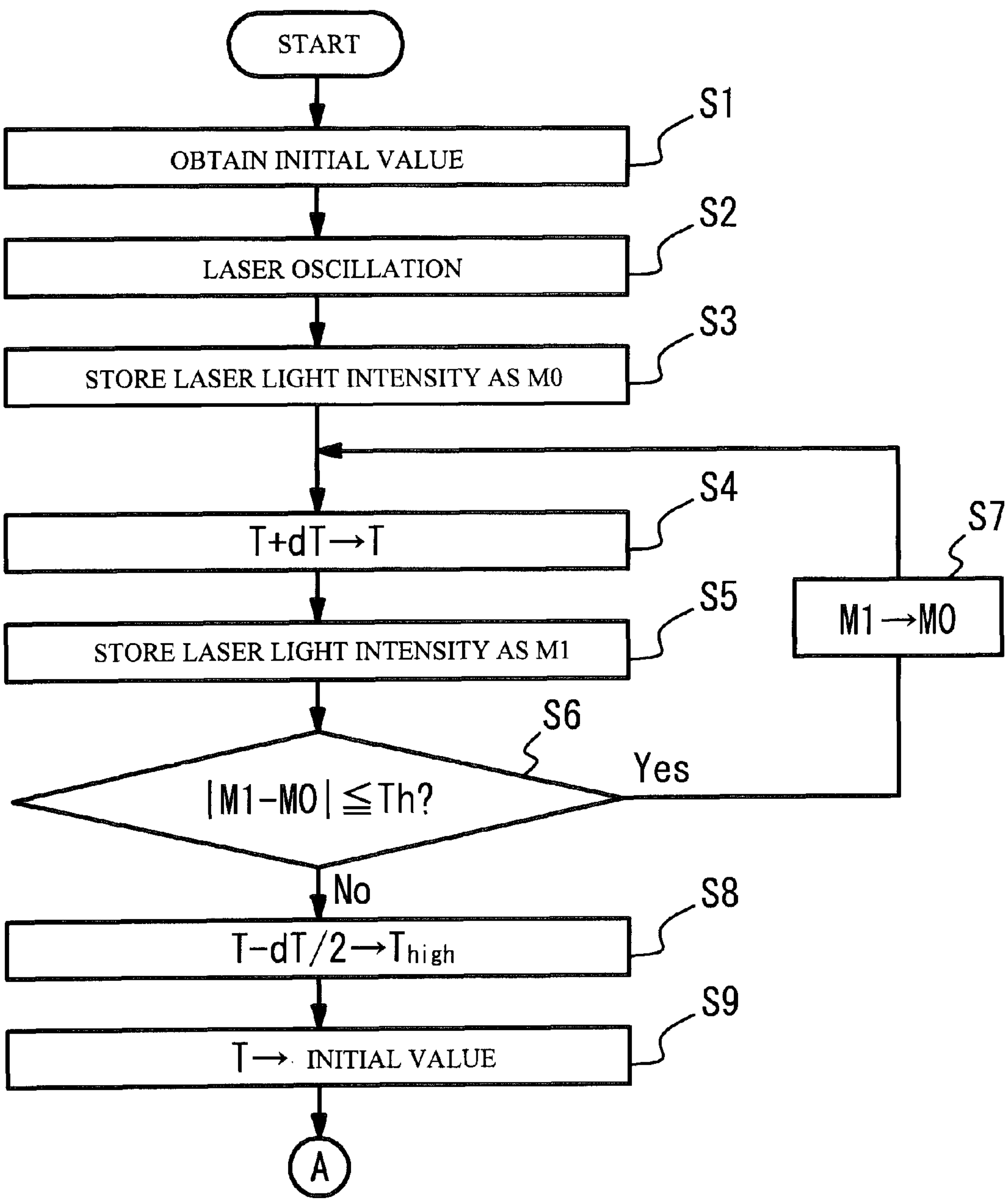
FIG. 8 illustrates a flowchart showing an example of a control of the wavelength-tunable laser.
Figure 9:
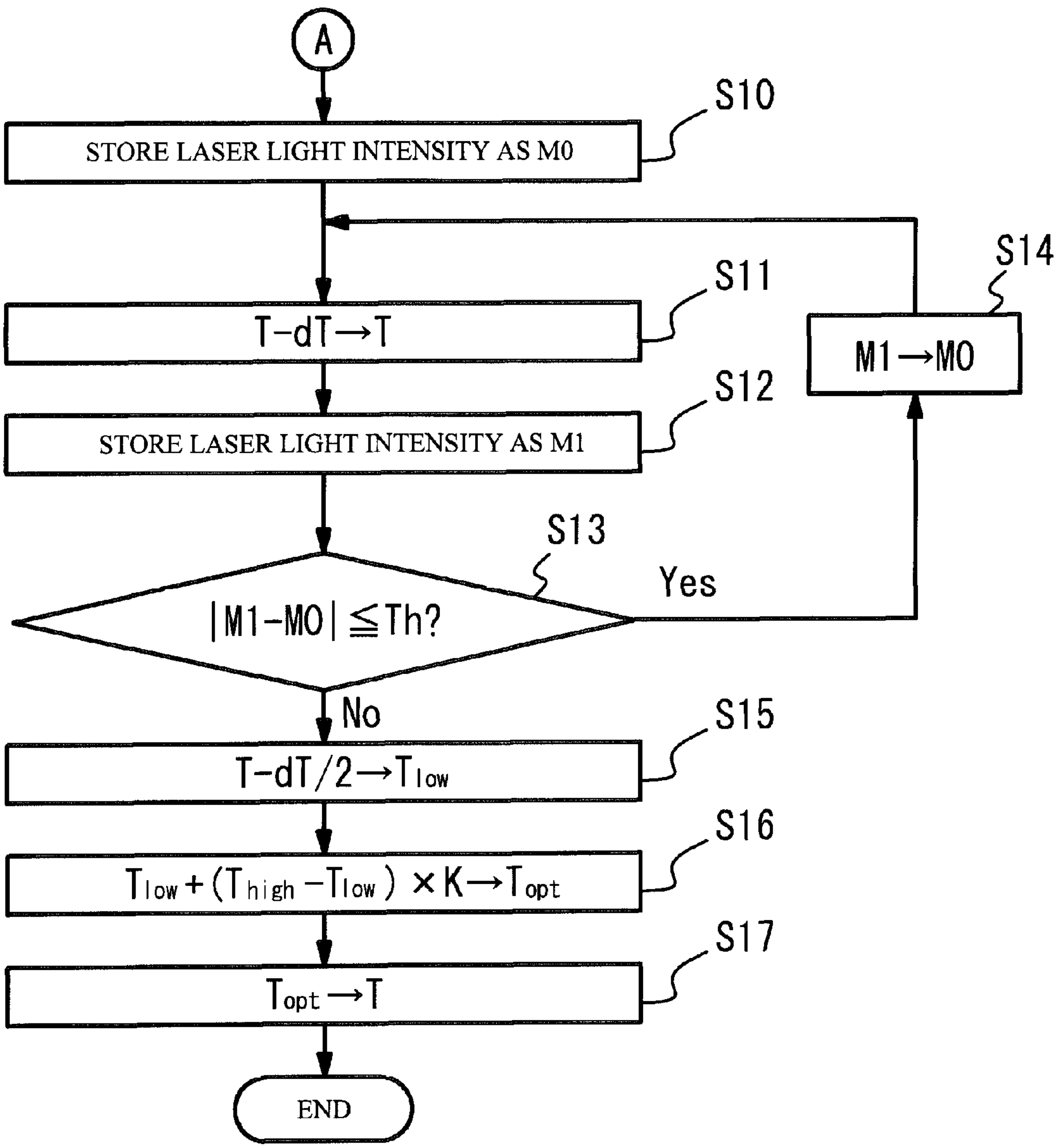
FIG. 9 illustrates the flowchart showing the example of the control of the wavelength-tunable laser.

FIG. 8 and FIG. 9 illustrate a flowchart showing an example of a control of the wavelength-tunable laser 10. As illustrated in FIG. 8, the controller 50 refers to the look-up table 51, and obtains the initial current $I_{LD}$, the initial current $I_{SOA}$, the initial currents $Ia_{Heater}$ through $Ic_{Heater}$ and the initial temperature $T_{LD}$ (Step S1).

Next, the controller 50 controls the wavelength-tunable laser 10 so as to oscillate according to the initial setting values obtained in Step S1 (Step S2). Then, the controller 50 measures the laser light intensity with the photo diode 43, and stores the measured value as a parameter M0 (Step S3). Next, the controller 50 increases the electrical power provided to the heaters 14*a* through 14*c*, and adds a step value dT to the average temperature T of the heaters 14*a* through 14*c* (Step S4).

Then, the controller 50 measures the laser light intensity with the photo diode 43 and stores the measured value as a parameter M1 (Step S5). Next, the controller 50 determines whether an absolute value |M1−M0| is threshold Th or smaller (Step S6). If |M1−M0| is the threshold Th or smaller in Step S6, the controller 50 stores the parameter M1 as the parameter M0 (Step S7), and executes Step S4 again.

If |M1−M0| is more than the threshold Th, the controller 50 stores (the average temperature T−dT/2) as a parameter $T_{high}$ (Step S8). Next, the controller 50 resets the average temperature T as an initial value (Step S9).

Then, the controller 50 measures the laser light intensity with the photo diode 43 and stores the measured value as the parameter M0 (Step S10). Next, the controller 50 reduces the electrical power provided to the heaters 14*a* through 14*c*, and decreases the average temperature T of the heaters 14*a* through 14*c* by the step value dT (Step S11).

Then, the controller 50 measures the laser light intensity with the photo diode 43 and stores the measured value as the parameter M1 (Step S12). Next, the controller 50 determines whether the absolute value |M1−M0| is the threshold Th or smaller (Step S13). If the |M1−M0| is the threshold or smaller in Step S13, the controller 50 stores the parameter M1 as the parameter M0 (Step S14) and executes the Step S11.

If the |M1−M0| is more than the threshold Th in Step S13, the controller 50 stores (the average temperature T+dT/2) as a parameter $T_{low}$ (Step S15). Next, the controller 50 stores a parameter $T_{opt}$ of $(T_{low}+(T_{high}-T_{low})\times k(0<k<1))$ as the optimal average temperature (Step S16). Then, the controller 50 controls the electrical power provided to the heaters 14*a* through 14*c* so that the average temperature T is tuned to $T_{opt}$ (Step S17). After that, the controller 50 quits the flowchart.

It is possible to determine the optimal average temperature of the heaters 14*a* through 14*c* by tuning the average temperature by constant step width and detecting the laser light intensity from the back edge. The value "k" is more than 0 and less than 1 and is 0.5, for example.

The following points are considered with respect to the coefficient "k" adopted in a calculation of the optimal value, in the following embodiment.

(1) "k" may be 0.5, when changing allowance of the heater temperature is considered. In this case, the heater temperature is set at center of a step range (a range "A" in FIG. 1) of the wavelength-tunable laser. It is therefore possible to select the most allowable point with respect to the changing of the heater control condition.

(2) There is a case where "k" is adopted so that a maximum output light intensity (minimum in case of monitor outputting) is obtained, in view of the stability of the laser oscillation condition. For example, a differential is generated in optical output intensity, within a step range of the wavelength-tunable laser, as illustrated in FIG. 4B. In this case, the oscillation condition is stable at a point where optical intensity in the resonator is the most (a minimum value in the case of rear monitor outputting in FIG. 4B). It is preferable that "k" is selected to be 0.7 when the above-mentioned point is selected.

Figure 10:
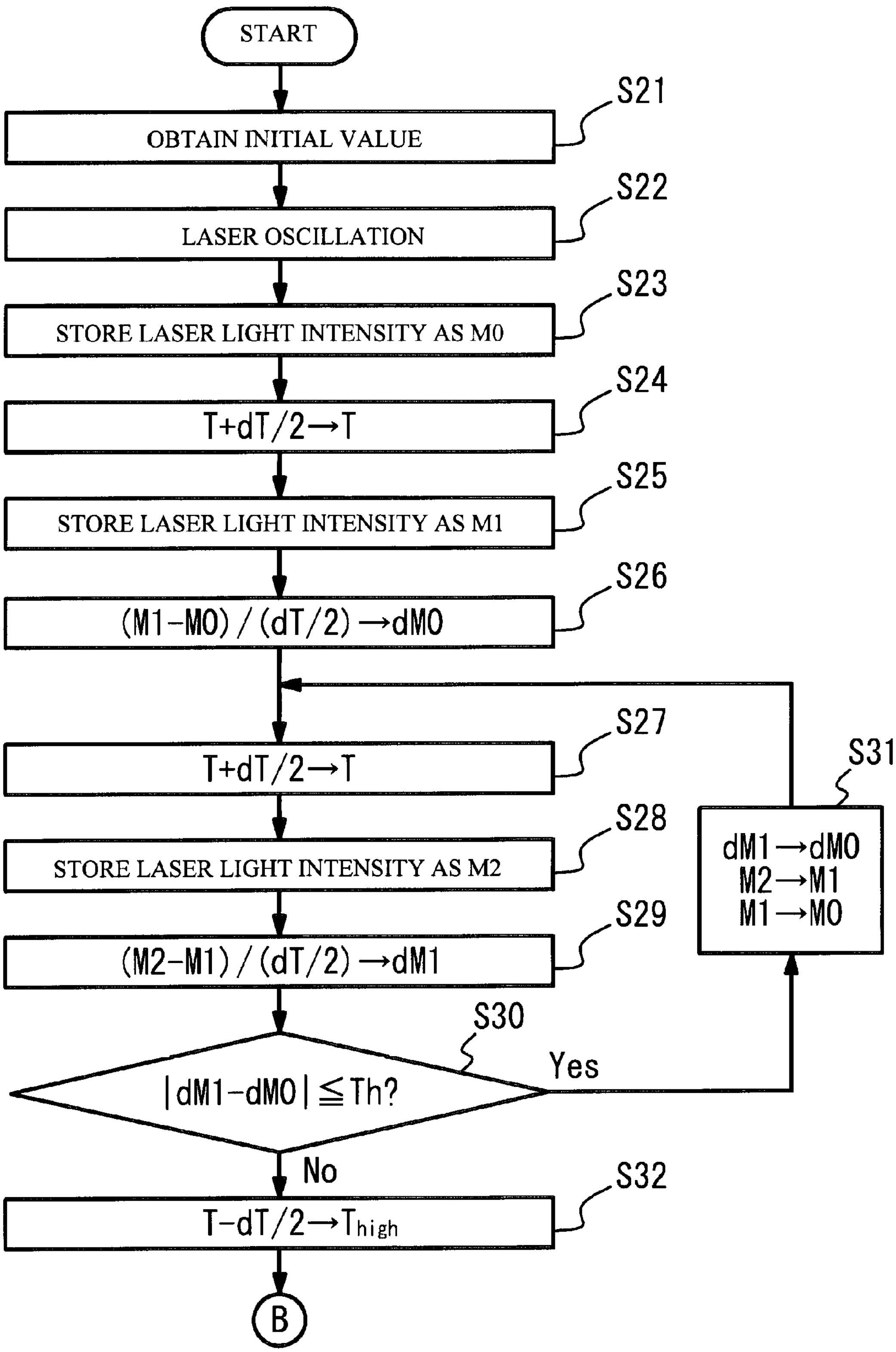
FIG. 10 illustrates a flowchart showing another example of a control of the wavelength-tunable laser.
Figure 11:
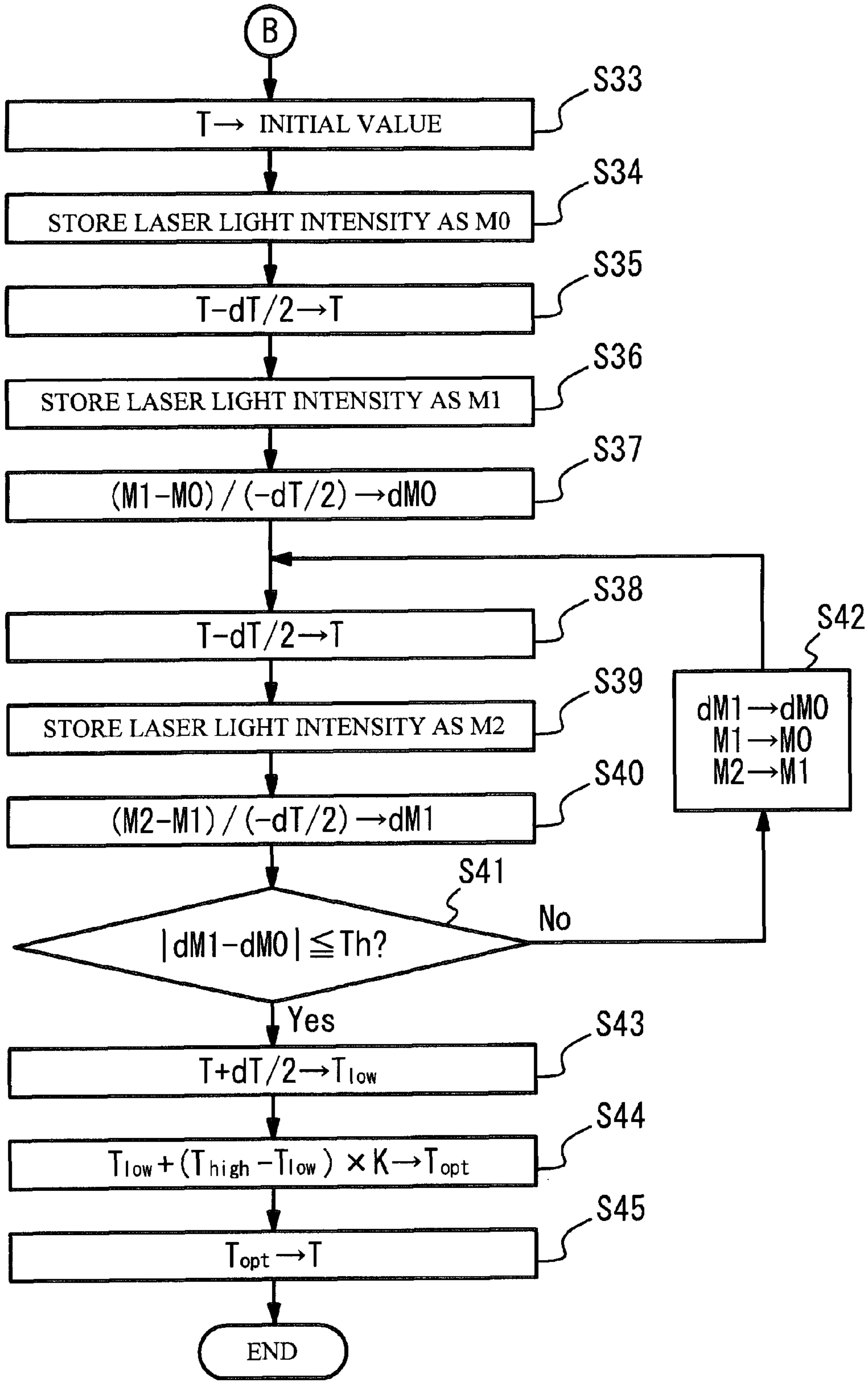
FIG. 11 illustrates the flowchart showing the example of the control of the wavelength-tunable laser.

FIG. 10 and FIG. 11 illustrate a flowchart showing another example of a control of the wavelength-tunable laser 10. As illustrated in FIG. 10, the controller 50 refers to the look-up table 51 and obtains the initial current $I_{LD}$, the initial current $I_{SOA}$, the initial currents $Ia_{Heater}$ through $Ic_{Heater}$ and the initial temperature $T_{LD}$ (Step S21).

Next, the controller 50 controls the wavelength-tunable laser 10 so as to oscillate according to the initial setting values obtained in Step S21 (Step S22). Then, the controller 50 measures the laser light intensity with the photo diode 43, and stores the measured value as a parameter M0 (Step S23). Next, the controller 50 increases the electrical power provided to the heaters 14*a* through 14*c*, and adds a step value dT to the average temperature T of the heaters 14*a* through 14*c* (Step S24). Then, the controller 50 measures the laser light intensity with the photo diode 43 and stores the measured value as a parameter M1 (Step S25). Next, the controller 50 stores a differential value ((M1−M0)/(dT/2)) as a parameter dM0 (Step S26).

Then, the controller 50 increases the electrical power provided to the heaters 14*a* through 14*c*, and adds a step value dT/2 to the average temperature T of the heaters 14*a* through 14*c* (Step S27). Then, the controller 50 measures laser light intensity with the photo diode 43, and stores the measured value as a parameter M2 (Step S28). Next, the controller 50 stores a differential value ((M2−M1)/(dT/2)) as a parameter dM1 (Step S29).

Then, the controller 50 determines whether an absolute value |dM1−dM0| is threshold Th or smaller (Step S30). If |dM1−dM0| is the threshold Th or smaller in Step S30, the controller 50 stores the parameter dM1 as the parameter dM0, stores the parameter M2 as the parameter M1, and stores the parameter M1 as a parameter M0 (Step S31), and executes Step S27 again. If |dM1−dM0| is more than the threshold Th in Step S30, the controller 50 stores (the average temperature T−dT/2) as a parameter $T_{high}$ (Step S32).

Next, the controller 50 resets the average temperature T as an initial value (Step S33). Then, the controller 50 measures the laser light intensity with the photo diode 43 and stores the measured value as the parameter M0 (Step S34). Next, the controller 50 decreases the electrical power provided to the heaters 14*a* through 14*c*, and decreases the average temperature T of the heaters 14*a* through 14*c* by the step value dT/2 (Step S35). Then, the controller 50 measures the laser light intensity with the photo diode 43 and stores the measured value as the parameter M1 (Step S36). Next, the controller 50 stores the differential value ((M1−M0)/(−dT/2)) as the parameter dM0 (Step S37).

Then, the controller 50 decreases the electrical power provided to the heaters 14*a* through 14*c*, and decreases the average temperature T of the heaters 14*a* through 14*c* by the step value dT/2 (Step S38). Then the controller 50 measures the laser light intensity with the photo diode 43, and stores the measured value as the parameter M2 (Step S39). Next, the controller 50 stores the differential value ((M2−M1)/(−dT/2)) as the parameter dM1 (Step S40).

Next, the controller 50 determines whether the absolute value |dM1−dM0| is the threshold Th or smaller (Step S41).

If the |dM1−dM0| is the threshold Th or smaller in Step S41, the controller 50 stores the parameter dM1 as the parameter dM0, stores the parameter M1 as the parameter M0 and stores the parameter M2 as the parameter M1 (Step S42), and executes Step S38.

If the |dM1−dM0| is the threshold Th or smaller in Step S41, the controller 50 stores (the average temperature T+dT/2) as a parameter $T_{low}$ (Step S43). Next, the controller 50 stores a parameter $T_{opt}$ of $(T_{low}+(T_{high}-T_{low})\times k\ (0<k<1))$ as the optimal average temperature (Step S44). Then, the controller 50 controls the electrical power provided to the heaters 14*a* through 14*c* so that the average temperature T is tuned to $T_{opt}$ (Step S45). After that, the controller 50 quits the flowchart.

It is possible to determine the optimal average temperature of the heaters 14*a* through 14*c* with the differential value of gain condition change. The value "k" is more than 0 and less than 1 and is 0.5, for example.

Figure 12:
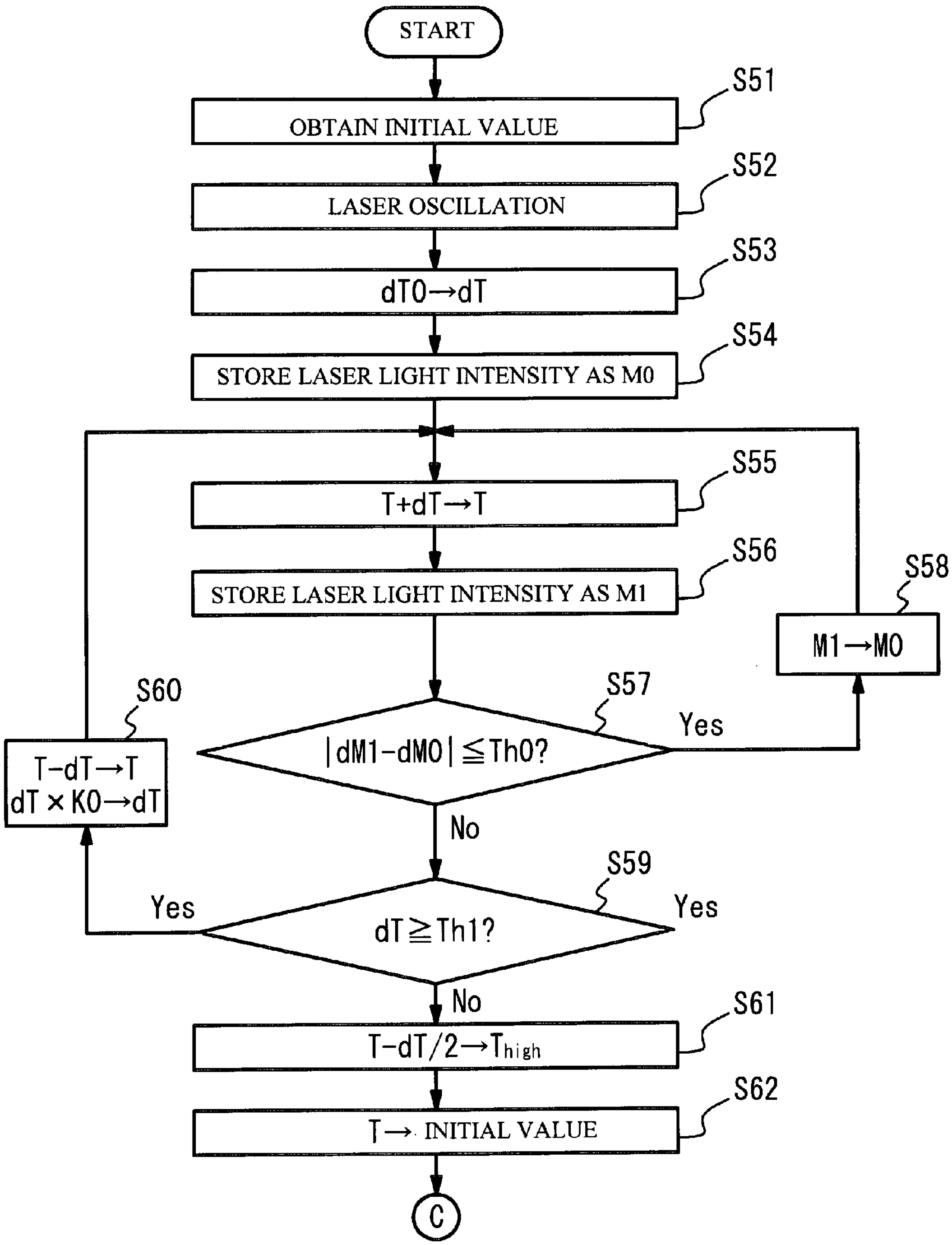
FIG. 12 illustrates a flowchart showing another example of a control of the wavelength-tunable laser.
Figure 13:
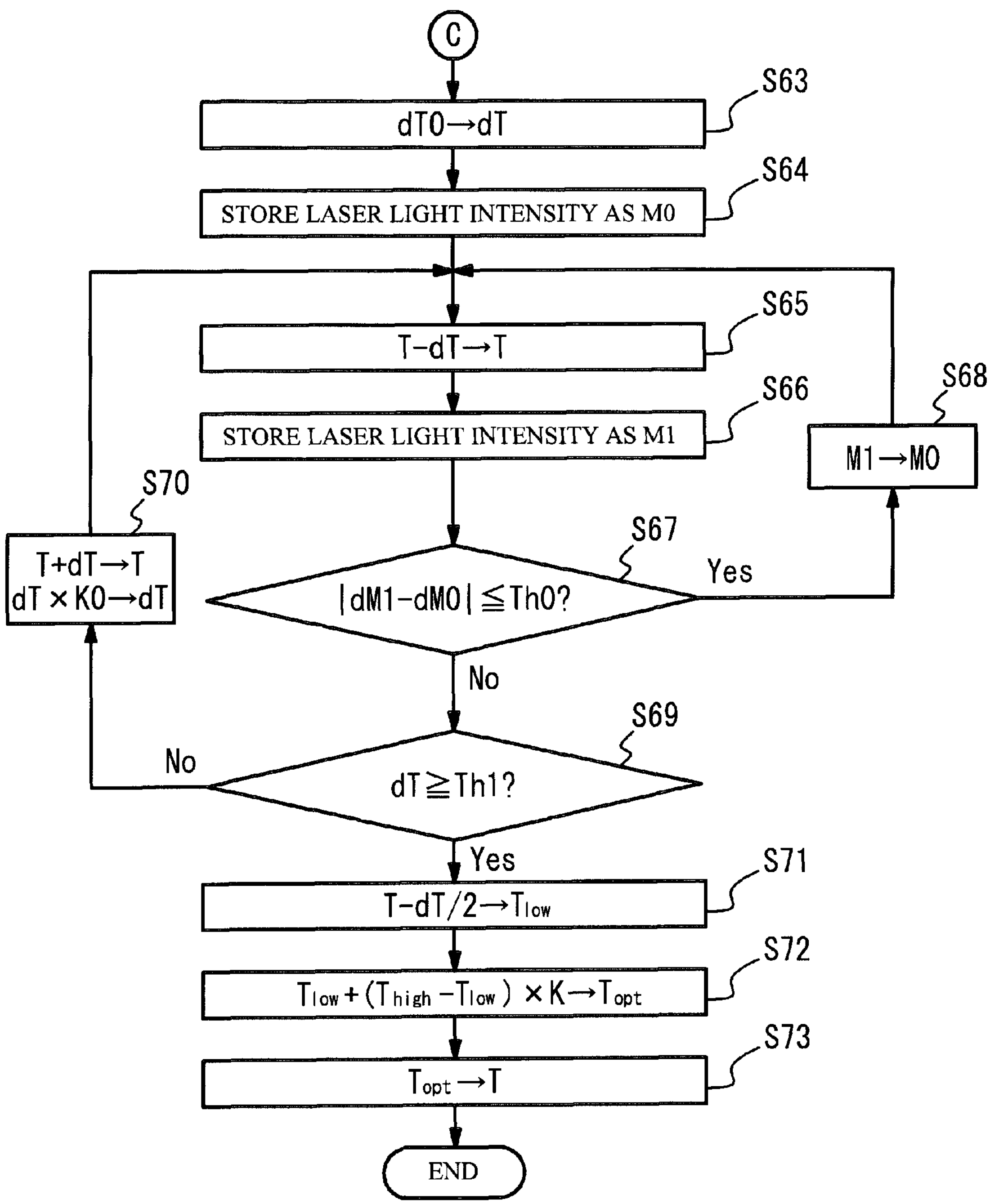
FIG. 13 illustrates the flowchart showing the example of a control of the wavelength-tunable laser.

FIG. 12 and FIG. 13 illustrate a flowchart showing another example of a control of the wavelength-tunable laser 10. As illustrated in FIG. 12, the controller 50 refers to the look-up table 51, and obtains the initial current $I_{LD}$, the initial current $I_{SOA}$, the initial currents $Ia_{Heater}$ through $Ic_{Heater}$ and the initial temperature $T_{LD}$ (Step S51).

Next, the controller 50 controls the wavelength-tunable laser 10 so as to oscillate according to the initial setting values obtained in Step S51 (Step S52). Then, the controller 50 stores an initial value dT0 as a step value dT (Step S53).

Next, the controller 50 measures the laser light intensity with the photo diode 43, and stores the measured value as a parameter M0 (Step S54). Next, the controller 50 increases the electrical power provided to the heaters 14*a* through 14*c*, and adds the step value dT to the average temperature T of the heaters 14*a* through 14*c* (Step S55).

Then, the controller 50 measures the laser light intensity with the photo diode 43 and stores the measured value as a parameter M1 (Step S56). Next, the controller 50 determines whether an absolute value |M1−M0| is threshold Th0 or smaller (Step S57). If |M1−M0| is the threshold Th0 or smaller in Step S57, the controller 50 stores the parameter M1 as a parameter M0 (Step S58), and executes Step S55 again.

If |M1−M0| is more than the threshold Th0 in Step S57, the controller 50 determines whether the step value dT is threshold Th1 or larger (Step S59). If the step value dT is the threshold Th1 or larger in Step S59, the controller 50 decreases the average temperature T by the step value dT, and stores the step value dT×k0 (0<k0<1) as the step value dT (Step S60), and executes Step S55 again.

If the step value dT is less than the threshold Th1 in Step S59, the controller 50 stores (the average temperature T−dT/2) as a parameter $T_{high}$ (Step S61). Next, the controller 50 resets the average temperature T to the initial value (Step S62).

Then, the controller 50 stores the initial value dT0 as the step value dT (Step S63), as illustrated in FIG. 13. Next, the controller 50 measures the laser light intensity with the photo diode 43, and stores the measured value as the parameter M0 (Step S64). Then, the controller 50 decreases the electrical power provided to the heaters 14*a* through 14*c*, and decreases the average temperature T of the heaters 14*a* through 14*c* by the step value dT (Step S65).

Then, the controller 50 measures the laser light intensity with the photo diode 43, and stores the measured value as the parameter M1 (Step S66). Next, the controller 50 determines whether the absolute value |M1−M0| is the threshold Th0 or smaller (Step S67). If |M1−M0| is the threshold Th0 or smaller in Step S67, the controller 50 stores the parameter M1 as the parameter M0 (Step S68), and executes Step S65.

If |M1−M0| is more than the threshold Th0 in Step S67, the controller 50 determines whether the step value dT is the threshold Th1 or larger (Step S69). If the step value dT is the threshold Th1 or larger in Step S69, the controller 50 adds the step value dT to the average temperature T, and stores (the step value dT×k0(0<k0<1)) as the step value dT (Step S70), and executes Step S65 again.

If the step value dT is less than the threshold Th1 in Step S69, the controller 50 stores (the average temperature T+dT/2) as a parameter $T_{low}$ (Step S71). Next, the controller 50 stores a parameter $T_{low}$ of $(T_{low}+(T_{high}-T_{low})\times k1\ (0<k1<1))$ as the optimal average temperature (Step S72). Then, the controller 50 controls the electrical power provided to the heaters 14*a* through 14*c* so that the average temperature T is $T_{opt}$ (Step S73). After that, the controller 50 quits the flowchart.

It is possible to determine the optimal average temperature of the heaters 14*a* through 14*c* by decreasing the step value dT gradually and detecting the laser light intensity from the back edge. The value "k1" is more than 0 and less than 1 and is 0.5, for example.

Figure 14:
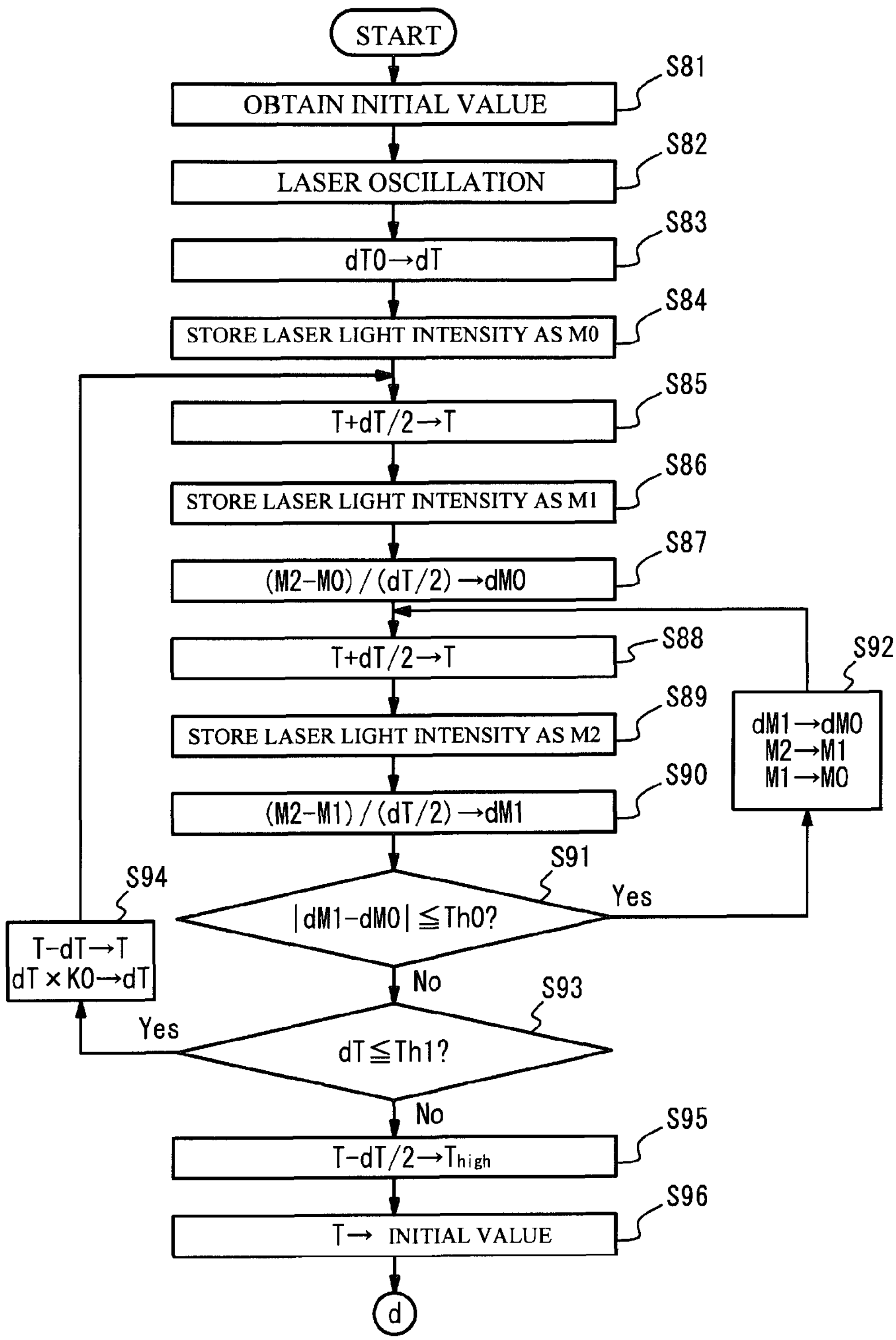
FIG. 14 illustrates a flowchart showing another example of a control of the wavelength-tunable laser.
Figure 15:
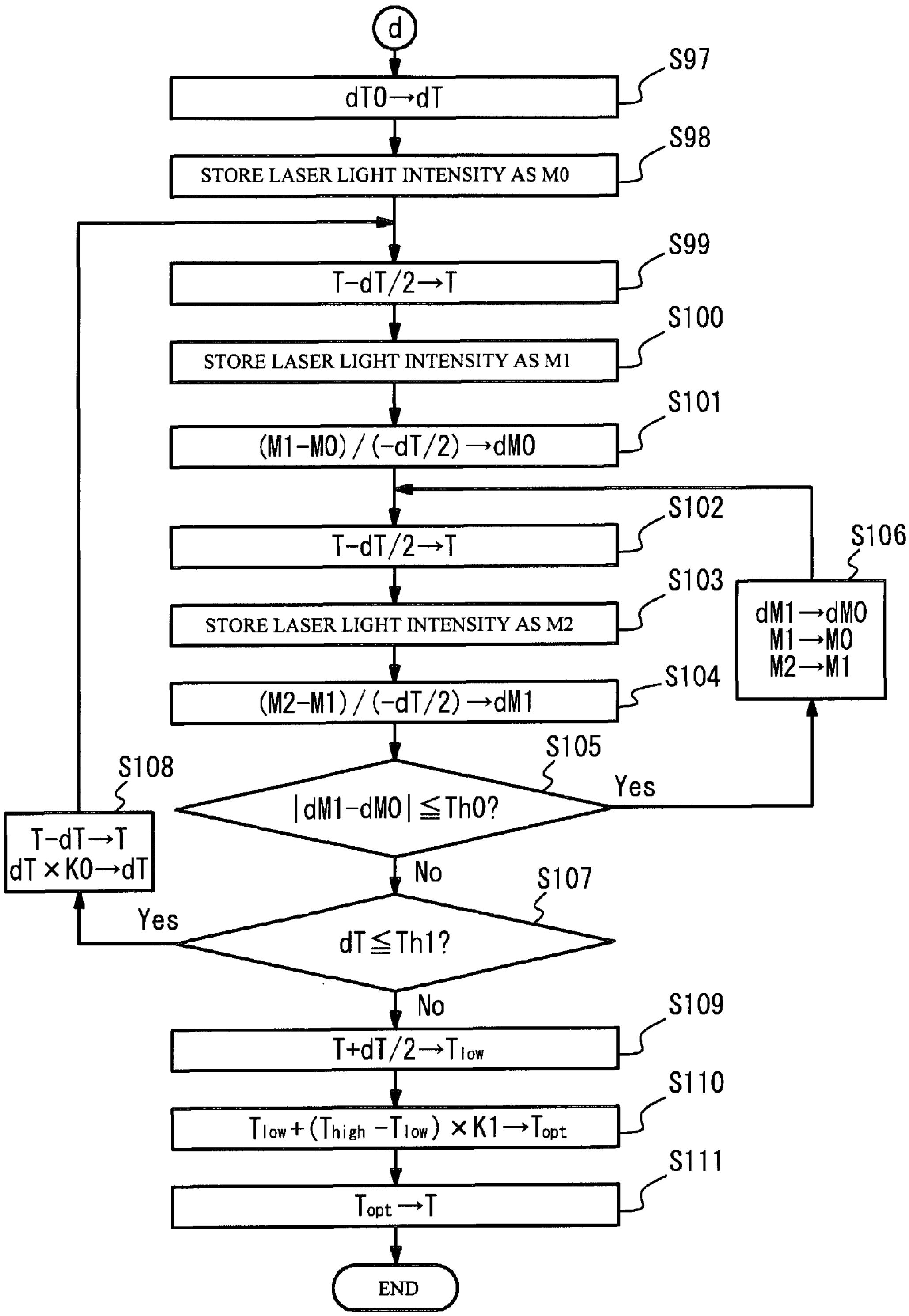
FIG. 15 illustrates the flowchart showing the example of a control of the wavelength-tunable laser.

FIG. 14 and FIG. 15 illustrate a flowchart showing another example of a control of the wavelength-tunable laser 10. As illustrated in FIG. 14, the controller 50 refers to the look-up table 51, and obtains the initial current $I_{LD}$, the initial current $I_{SOA}$, the initial currents $Ia_{Heater}$ through $Ic_{Heater}$ and the initial temperature $T_{LD}$ (Step S81).

Next, the controller 50 controls the wavelength-tunable laser 10 so as to oscillate according to the initial setting values obtained in Step S81 (Step S82). Then, the controller 50 stores an initial value dT0 as a step value dT (Step S83). Next, the controller 50 measures the laser light intensity with the photo diode 43, and stores the measured value as a parameter M0 (Step S84).

Next, the controller 50 increases the electrical power provided to the heaters 14*a* through 14*c*, and adds the step value dT/2 to the average temperature T of the heaters 14*a* through 14*c* (Step S85). Then, the controller 50 measures the laser light intensity with the photo diode 43 and stores the measured value as a parameter M1 (Step S86). Next, the controller 50 stores the differential value ((M1−M0)/(dT/2)) as a parameter dM0 (Step S87).

Then, the controller 50 increases the electrical power provided to the heaters 14*a* through 14*c*, and adds the step value dT/2 to the average temperature T of the heaters 14*a* through 14*c* (Step S88). Then, the controller 50 measures the laser light intensity with the photo diode 43, and stores the measured value as a parameter M2 (Step S89). Next, the controller 50 stores the differential value ((M2−M1)/(dT/2)) as a parameter dM1 (Step S90).

Then, the controller 50 determines whether the absolute value |dM1−dM0| is the threshold Th0 or smaller (Step S91). If the |dM1−dM0| is the threshold Th0 or smaller in Step S91, the controller 50 stores the parameter dM1 as the parameter dM0, stores the parameter M2 as the parameter M1, and stores the parameter M1 as the parameter M0 (Step S92), and executes Step S88 again.

If |dM1−dM0| is more than the threshold Th0 in Step S91, the controller 50 determines whether the step value dT is the threshold TH1 or larger (Step S93). If the step dT is the threshold Th1 or larger in Step S93, the controller 50 decreases the average temperature T by the step value dT, and stores (the step value dT×k0 (0<k0<1)) as the step value dT (Step S94), and executes Step S85.

If the step value dT is less than the threshold Th1 in Step S93, the controller 50 stores (the average temperature T−dT/2) as a parameter $T_{high}$ (Step S95). Next, the controller 50 resets the average temperature T to the initial value (Step S96).

Then, as illustrated in FIG. 15, the controller 50 stores the initial value dT0 as the step value dT (Step S97). Next, the controller 50 measures the laser light intensity with the photo diode 43, and stores the measured value as the parameter M0 (Step S98). Next, the controller 50 decreases the electrical power provided to the heaters 14*a* through 14*c*, and decreases the average temperature T of the heaters 14*a* through 14*c* by the step value dT/2 (Step S99). Then, the controller 50 measures the laser light intensity with the photo diode 43, and stores the measured value as the parameter M1 (Step S100). Next, the controller 50 stores the differential value ((M1−M0)/(−dT/2)) as the parameter dM0 (Step S101).

Next, the controller 50 decreases the electrical power provided to the heaters 14*a* through 14*c*, and decreases the average temperature T of the heaters 14*a* through 14*c* by the step value dT/2 (Step S102). Then, the controller 50 measures the laser light intensity with the photo diode 43, and stores the measured value as the parameter M2 (Step S103). Next, the controller 50 stores the differential value ((M2−M1)/(−dT/2)) as the parameter dM1 (Step S104).

Then, the controller 50 determines whether the absolute value |dM1−dM0| is the threshold Th0 or smaller (Step S105). If |dM1−dM0| is the threshold Th0 or smaller in Step S105, the controller 50 stores the parameter dM1 as the parameter dM0, store the parameter M1 as the parameter M0 and store the parameter M2 as the parameter M1 (Step S106), and executes Step S102 again.

If |dM1−dM0| is more than the threshold Th0 in Step S105, the controller 50 determines whether the step value dT is the threshold Th1 or larger (Step S107). If the step value dT is the threshold Th1 or larger in Step S107, the controller 50 adds the step value dT to the average temperature T, and stores (the step value dT×k0 (0<k0<1)) as the step value dT (Step S108), and executes Step S99 again.

If the step value dT is less than the threshold Th1 in Step S107, the controller 50 stores (the average temperature T+dT/2) as a parameter $T_{low}$ (Step S109). Next, the controller 50 stores a parameter $T_{opt}$ of ($T_{low}$+($T_{high}$−$T_{low}$)×k1 (0<k1<1)) as the optimal average temperature (Step S110). Then, the controller 50 controls the electrical power provided to the heaters 14*a* through 14*c* so that the average temperature T is tuned to $T_{opt}$ (Step S111). After that, the controller 50 quits the flowchart.

It is possible to determine the optimal average temperature of the heaters 14*a* through 14*c* by decreasing the step value dT gradually and detecting the laser light intensity. The value "k1" is more than 0 and less than 1 and is 0.5, for example.

The optimal average temperature may be detected when the wavelength of the wavelength-tunable laser 10 is switched after the output of the wavelength-tunable laser is stopped once, although the optimal average temperature is detected at the starting in the embodiment. The average temperature may be optimized after the laser device 100 is set in an actual operation environment. In this case, it is possible to correct a differential between a testing environment where the control information in the look-up table 51 is obtained and an actual environment. The detected optimal average temperature or the electrical power provided to the heaters for determining the optimal average temperature may be stored in the look-up table 51.

The equivalent refractive index of the optical waveguide of the SG-DFB region 12 may be tuned and the discontinuity point of the gain condition may be detected, although the equivalent refractive index of the optical waveguide of the CSG-DBR region 11 is tuned and the discontinuity of the gain condition is detected in the embodiment. The discontinuity of both of the differential values of the gain condition changing and the gain condition changing may be detected. In this case, detection accuracy of mode skipping may be improved.

Second Embodiment

Figure 16:
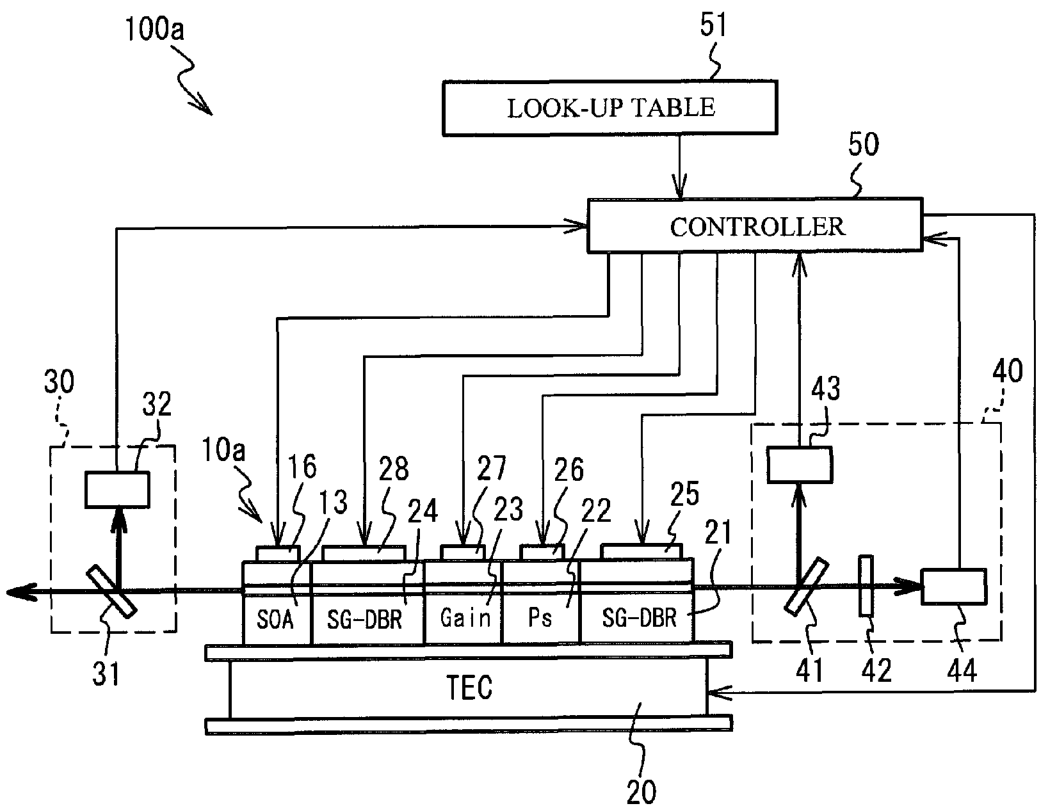
FIG. 16 illustrates a schematic view of a laser device in accordance with a second embodiment.

FIG. 16 illustrates a schematic view of a laser device 100*a* in accordance with a second embodiment. The laser device 100*a* is different from the laser device 100 in a point that a wavelength-tunable laser 10*a* is provided instead of the wavelength-tunable laser 10.

As illustrated in FIG. 16, the wavelength-tunable laser 10*a* has a structure in which a SG-DBR (Sampled Grating Distributed Bragg Reflector) region 21, a PS (Phase Shift) region 22, a Gain region 23, a SG-DBR region 24 and the SOA region 13 are coupled in order.

The SG-DBR regions 21 and 24 have an optical waveguide having segments in which a first region having a diffraction grating and a second region coupled to the first region and acting as a spacer are provided. The optical waveguide is made of semiconductor crystalline having an absorption edge wavelength at shorter wavelengths side compared to the laser oscillation wavelength. Each second region has a length equal to each other in the SG-DBR regions 21 and 24. A heater 25 is provided on the SG-DBR region 21. A heater 28 is provided on the SG-DBR region 24. The equivalent refractive index of the optical waveguide of the SG-DBR region 21 is controlled with the temperature control of the heater 25. The equivalent refractive index of the optical waveguide of the SG-DBR region 24 is controlled with the temperature control of the heater 28.

The PS region 22 includes an optical waveguide made of semiconductor crystalline having an absorption edge wavelength at shorter wavelengths side compared to the laser oscillation wavelength. An electrode 26 is an electrode for providing current to the PS region 22. The gain region 23 includes an optical waveguide made of semiconductor crystalline amplifying a light of a desirable wavelength of a laser oscillation. An electrode 27 is an electrode for providing a current to the Gain region 23.

A period of wavelength peak of the SG-DBR region 21 is different from that of the SG-DBR region 24. The SG-DBR region 21 and the SG-DBR region 24 act as a wavelength selection portion. The PS region 22 acts as a wavelength selection portion because the PS region 22 can control a longitudinal mode with phase adjusting. The oscillation wavelength is selected when the wavelength property of the SG-DBR regions 21 and 24 and the PS region 22 is changed. The wavelength property of the SG-DBR regions 21 and 24 may be controlled with as least one of a combination of the heaters 25 and 28 and the temperature control device 20.

It is possible to obtain an optimal temperature of the heater 25 and 28 or an optimal current of the PS region 22 by tuning wavelength property of at least one of the SG-DBR regions 21 and 24 and the PS region 22 and detecting the discontinuity of the gain condition changing of the wavelength-tunable laser 10*a* at the starting or the wavelength switching, with the wavelength-tunable laser 10*a*.

Third Embodiment

Figure 17:
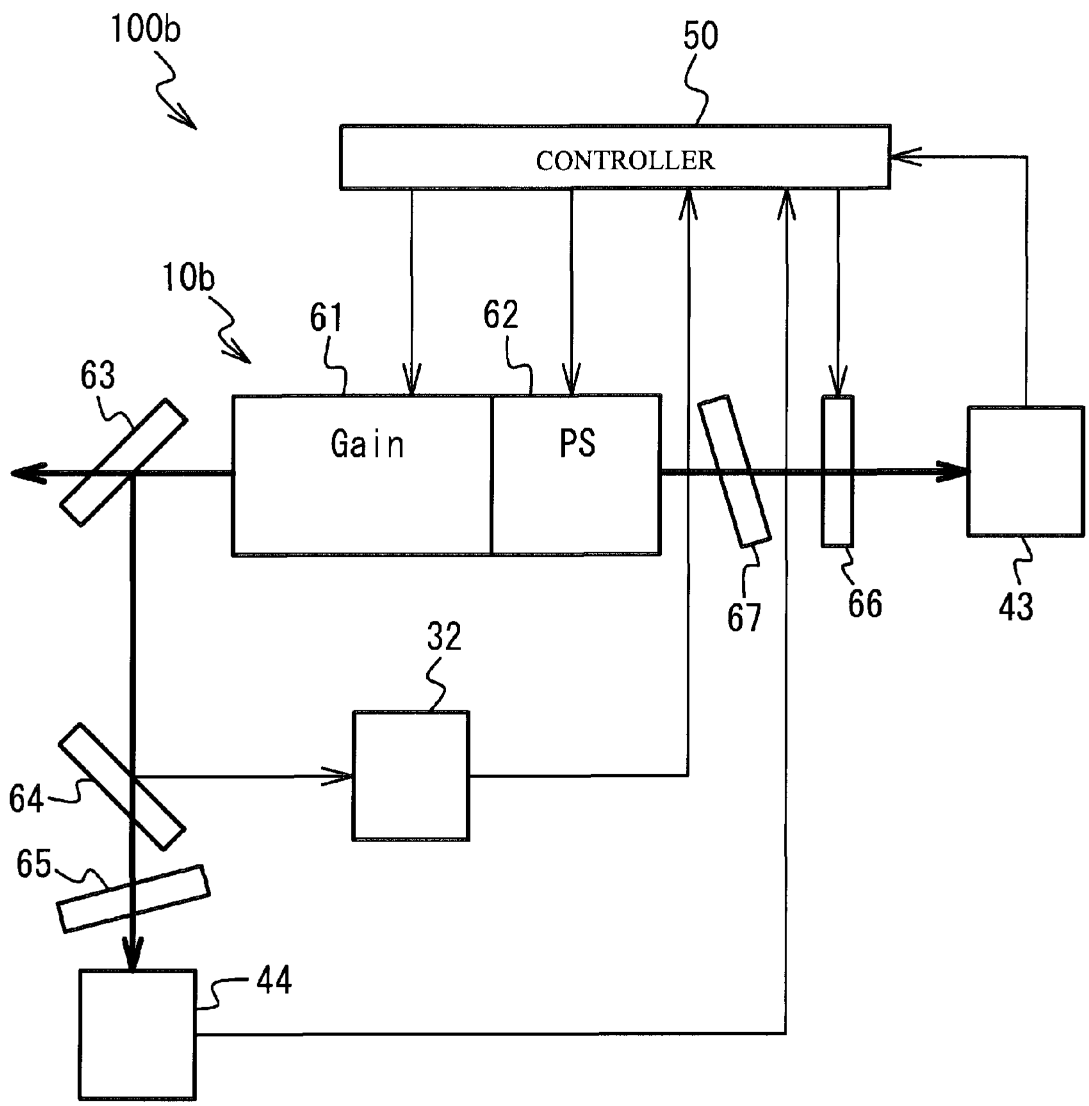
FIG. 17 illustrates a schematic view of a laser device in accordance with a third embodiment.

FIG. 17 illustrates a schematic view of a laser device 100*b* in accordance with a third embodiment. As illustrated in FIG. 17, the laser device 100*b* has a Gain element 10*b* composed of a Gain region 61 and a PS region 62. There are provided a fixed etalon 67 and a liquid crystal mirror 66 in order on the PS region 62 side of the Gain element 10*b*. The fixed etalon 67 is an optical etalon having periodical transparent wavelength peak. The liquid crystal mirror 66 has a structure in which a liquid crystal etalon is integrated with a mirror for forming a resonator between the mirror and the edge face of the Gain region 61. Here, the liquid crystal etalon has an optical etalon structure where a liquid crystal region is sealed, refractive index of the liquid crystal being controllable with voltage. The liquid crystal mirror 66 in accordance with the embodiment has a liquid crystal etalon having wavelength peak different from that of the fixed etalon 67. Peak of reflection wavelength property can be changed according to voltage implied thereto.

In the embodiment, a wavelength may be selected with a vernier effect, when the wavelength property of the fixed etalon 67 is relatively changed with respect to the wavelength property of the liquid crystal mirror 66. The PS region 62 stably controls a longitudinal mode selected with an overlap between the wavelength property peaks of the fixed etalon 67 and the liquid crystal mirror 66. In the embodiment, both the liquid crystal mirror 66 and the fixed etalon 67 act as a wavelength selection portion.

A beam splitter 63 reflects a part of a laser light from the Gain region 61 side. The reflected laser light is given to a beam splitter 64. The beam splitter 64 gives a part of a light to a photo diode 44 and the rest to the photo diode 32. There is provided an etalon 65 between the beam splitter 64 and the photo diode 44.

The controller 50 may select wavelength by controlling voltage implied to the liquid crystal mirror 66 and current provided to the PS region 62. The controller 50 detects the laser light intensity according to the detection result of the photo diode 32, and detects wavelength of the laser light according to the detection result of the photo diodes 43 and 44.

It is possible to obtain an optimal operating point of wavelength selection property of at least one of the PS region 62 and the liquid crystal mirror 66 by tuning wavelength property of at least one of the PS region 62 and the liquid crystal mirror 66 and detecting the discontinuity of the gain condition changing of a resonator type laser at a starting or a wavelength switching thereof.

Fourth Embodiment

In a fourth embodiment, the present invention is applied in a case where a width of a terrace is known. In the embodiment, the optimal average temperature T is determined with detection of discontinuity of one of gain conditions of high temperature side and low temperature side, because the width of the terrace is known. That is, the optimal average temperature T may be determined when one of the boundary A1 and the boundary A2 is obtained, if the range A is known, with reference to FIG. 1. This results in shortening of a time for detecting the boundary, compared to a case where both of the boundary A1 and the boundary A2 are detected.

Figure 18:
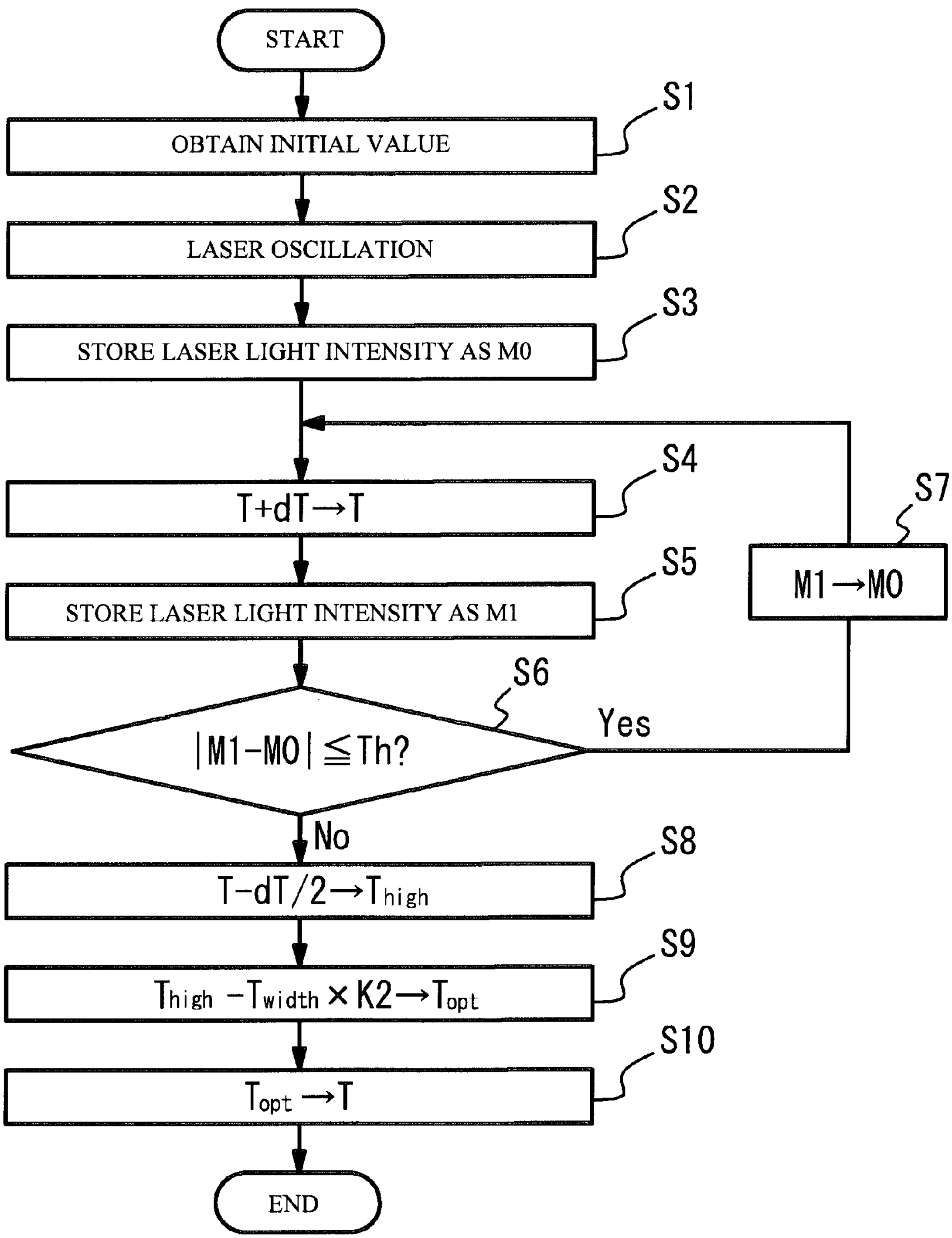
FIG. 18 illustrates a flowchart showing an example of a control of the wavelength-tunable laser.

FIG. 18 illustrates a flowchart. In FIG. 18, this embodiment is applied to the laser device illustrated in FIG. 2. Steps S1 through S8 are the same as in the case of FIG. 8. Therefore, explanation of Steps S1 through S8 is omitted.

In the embodiment, the controller 50 calculates the optimal average temperature T according to the higher boundary $T_{high}$ obtained in Step S8. The optimal average temperature is calculated with an equation as $T_{opt}=T_{high}-T_{Width}\times k2$ ($0<k2<1$). $T_{Width}$ indicates a temperature width of the terrace, and is stored in the look-up table 51 in advance. "k2" is set to be 0.5 in a case where a center of $T_{Width}$ is the optimal average temperature point.

In Step S10, the controller 50 controls the electrical power provided to the heater so that the average temperature T equals to $T_{opt}$. With the operations, the average temperature T is optimized.

$T_{Width}$ stored in the look-up table 51 is obtained accurately with use of a wavelength meter or the like in advance. There is a case where the terraces according to each wavelength are different from each other. Therefore, the $T_{Width}$ of all terraces may be measured in order to improve an accuracy of the optimal average temperature T. The $T_{Width}$ according to a desirable oscillation wavelength is obtained from the look-up table 51 if $T_{Width}$ is obtained with respect to every terrace.

$T_{Width}$ of one terrace may be measured and $T_{Width}$ of another terrace may be calculated according to the measured $T_{width}$ and a ratio. $T_{Width}$ of each terrace may be determined not with the wavelength meter but with a designed value of a laser chip in order to simplify obtainment of $T_{Width}$. $T_{Width}$ may be determined from a representative chip per wafer or per lot, other than the method obtaining $T_{Width}$ for every laser chip. The discontinuity on the low temperature side ($T_{low}$) may be detected, although the discontinuity on the high temperature side (Thigh) is detected in the above-mentioned embodiment. In the embodiment, the Gain element 10*b* corresponds to the wavelength-tunable laser.

In the above-mentioned embodiments, the controller 50 corresponds to the discontinuity detector and the setting portion of the operating point.

Fifth Embodiment

In a fifth embodiment, a determining method of the optimal operating point used for optimization control of the electrical power provided to the heaters 14*a* through 14*c* in the first through fourth embodiment is applied to a calibration process before shipping. With the calibration method, the optimal operating value of the electrical power provided to the heaters 14*a* through 14*c* may be obtained. In this embodiment, the electrical power provided to the heaters 14*a* through 14*c* is controlled, although the average temperature T of the heaters 14*a* through 14*c* is controlled in order to determine the optimal operating value in the first through fourth embodiments. A description will be given of the calibration method in accordance with this embodiment.

Figure 19:
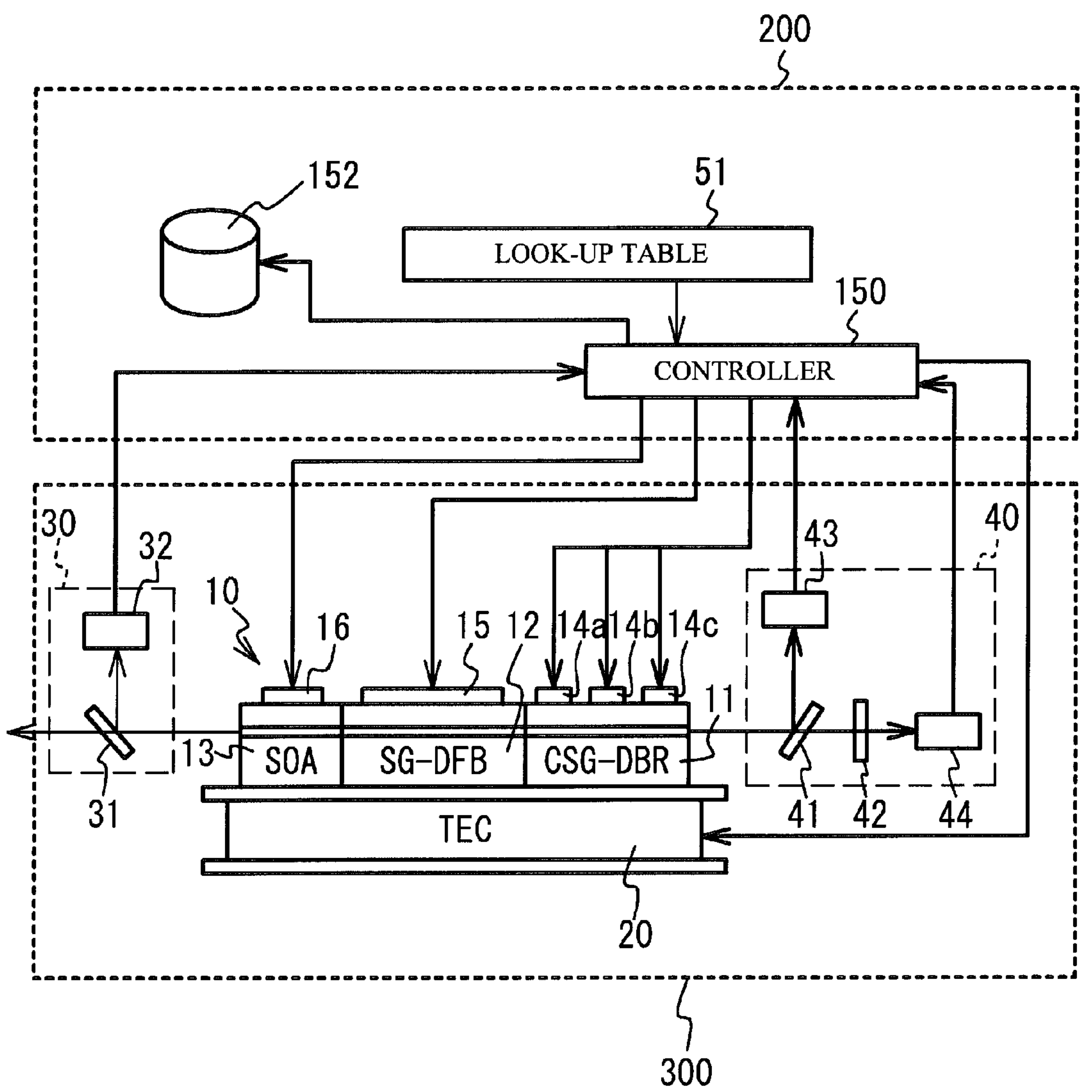
FIG. 19 illustrates a schematic view of a calibration device in accordance with a fifth embodiment.

FIG. 19 illustrates a schematic view of a calibration device 200 in accordance with the fifth embodiment. The calibration device 200 includes the look-up table 51, a controller 150, an outer memory 152 and so on. The calibration device 200 is connected to a laser unit 300. The laser unit 300 has a structure in which the wavelength-tunable laser 10, the temperature control device 20, the output detector 30, and the wavelength detector 40 are housed in a laser package.

The wavelength-tunable laser 10, the temperature control device 20, the output detector 30 and the wavelength detector 40 are the same as those illustrated in FIG. 2. The controller 150 has an electrical power supply and a control portion such as a CPU, a RAM, a ROM. With the calibration method in accordance with the embodiment, it is possible to conduct a test for obtaining an optimal control value at every wavelength of the unit. A description will be given of details.

Figure 20:
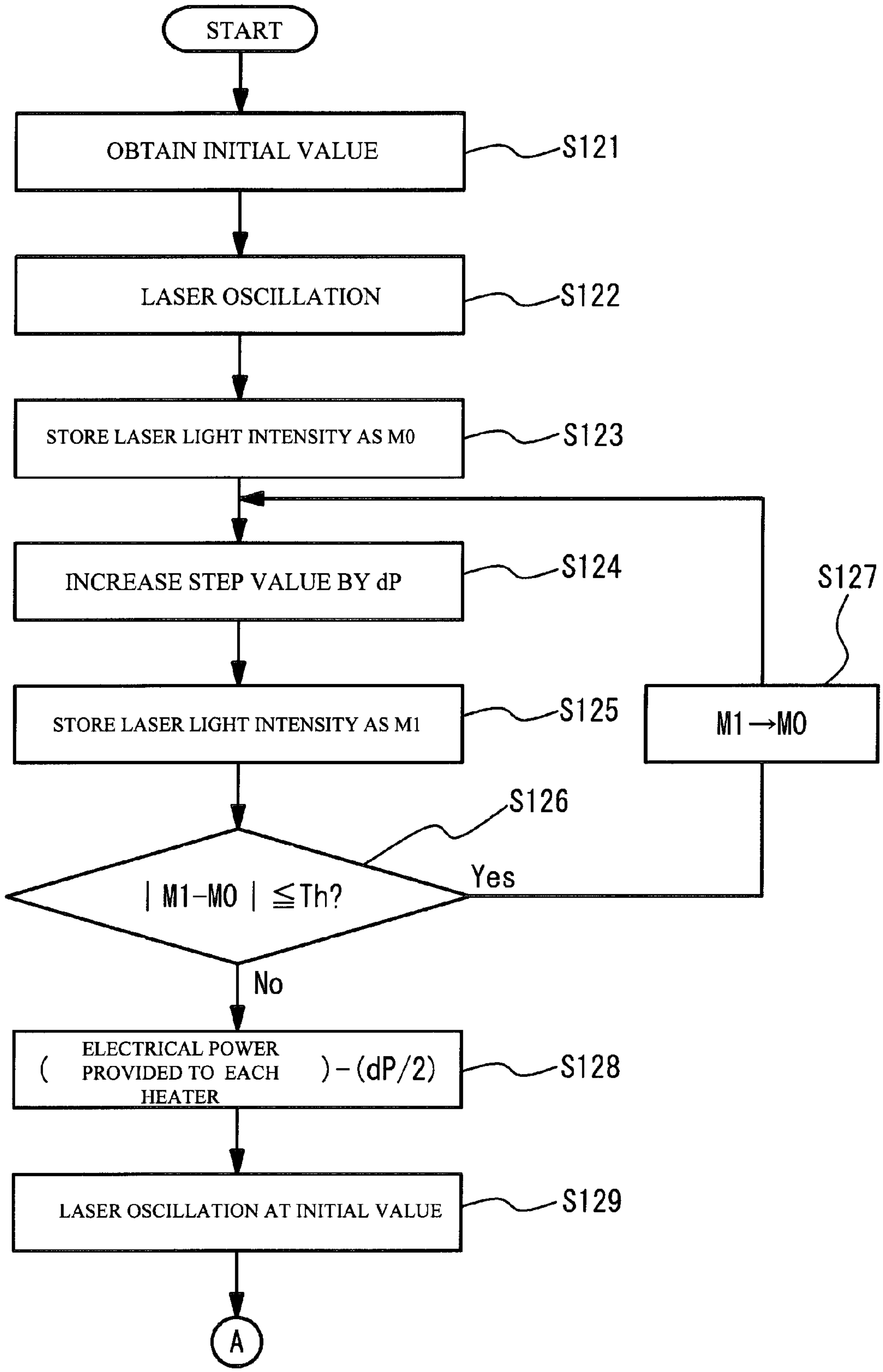
FIG. 20 illustrates a flowchart showing a calibration process of a laser unit.
Figure 21:
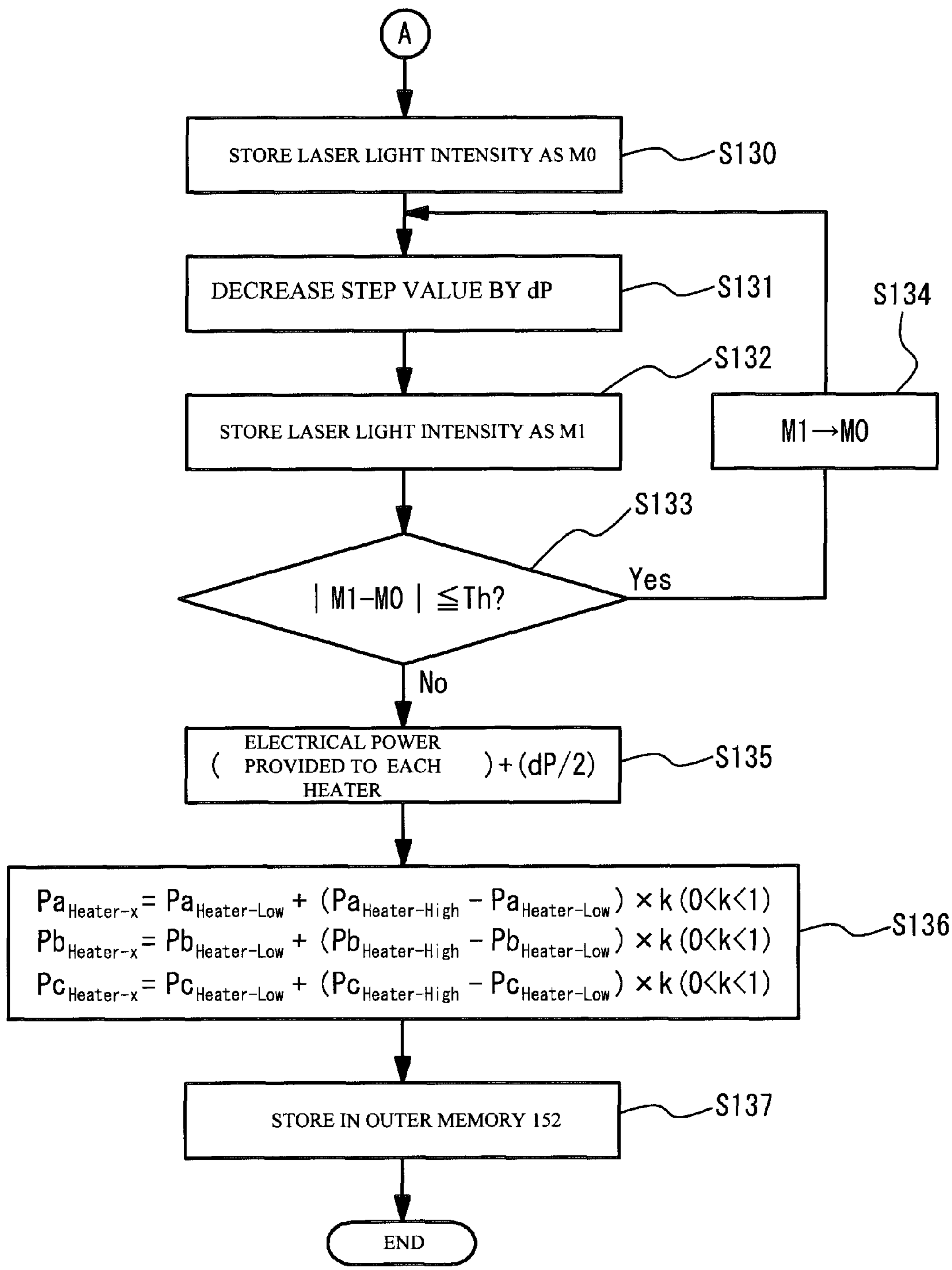
FIG. 21 illustrates the flowchart showing the calibration process of the laser unit.

FIG. 20 and FIG. 21 illustrate a flowchart showing the calibration process of the laser unit 300. As illustrated in FIG. 20, the controller 150 refers to the look-up table 51, and obtains the initial current $I_{LD}$, the initial current $I_{SOA}$, the initial currents $Ia_{Heater}$ through $Ic_{Heater}$ and the initial temperature $T_{LD}$ (Step S121).

Next, the controller 150 controls the wavelength-tunable laser 10 so as to oscillate according to the initial setting values obtained in Step S121 (Step S122). Then, the controller 150 measures the laser light intensity with the photo diode 43, and stores the measured value as a parameter M0 (Step S123). Next, the controller 50 increases the electrical power provided to the heaters 14*a* through 14*c*, and adds a step value dP to the electrical power of the heaters 14*a* through 14*c* (Step S124).

Then, the controller 150 measures the laser light intensity with the photo diode 43 and stores the measured value as a parameter M1 (Step S125). Next, the controller 150 calculates absolute value |M1−M0|, and determines whether the absolute value |M1−M0| is more than a threshold Th (Step S126).

If |M1−M0| is the threshold Th or smaller in Step S126, the controller 150 stores the parameter M1 as the parameter M0 (Step S127), and executes Step S124 again. If |M1−M0| is more than the threshold Th in Step S126, the controller 150 stores the electrical power provided to the heaters 14*a* through 14$c$ at the time reduced by the step value dP/2 respectively as $Pa_{Heater\text{-}High}$ through $Pc_{Heater\text{-}High}$ (Step S128).

Next, the controller 150 controls the wavelength-tunable laser 10 so as to oscillate according to the initial setting values as in the case of Step S122 (Step S129). Then, the controller 150 measures the laser light intensity with the photo diode 43 and stores the measured value as the parameter M0 (Step S130). Next, the controller 150 decreases the electrical power provided to the heaters 14$a$ through 14$c$ by the step value dP (Step S131).

Then, the controller 150 measures the laser light intensity with the photo diode 43, and stores the measured value as a parameter M1 (Step S132). Next, the controller 150 calculates the absolute value |M1−M0|, and determines whether the absolute value is more than the threshold Th (Step S133).

If the absolute value |M1−M0| is the threshold Th or smaller in Step S133, the controller 150 stores the parameter M1 as the parameter M0 (Step S134), and executes Step S131 again. If the absolute value |M1−M0| is more than the threshold Th in Step S133, the controller 150 stores the electrical power provided to the heaters 14$a$ through 14$c$ at the time reduced by the step value dP/2 as the $Pa_{Heater\text{-}Low}$ through $Pc_{Heater\text{-}Low}$ (Step S135).

Next, the controller 150 calculates following equations (Step S136), and stores the calculation result in the outer memory 152 (Step S137).

$$Pa_{Heater\text{-}x}=Pa_{Heater\text{-}Low}+(Pa_{Heater\text{-}High}-Pa_{Heater\text{-}Low})\times k(0<k<1)$$

$$Pb_{Heater\text{-}x}=Pb_{Heater\text{-}Low}+(Pb_{Heater\text{-}High}-Pb_{Heater\text{-}Low})\times k(0<k<1)$$

$$Pc_{Heater\text{-}x}=Pc_{Heater\text{-}Low}+(Pc_{Heater\text{-}High}-Pc_{Heater\text{-}Low})\times k(0<k<1)$$

The processes are performed with respect to every required channel. Optimal target table of electrical-power control of the heaters 14$a$ through 14$c$ is generated, as illustrated in FIG. 22. A user controls the laser device based on the optimal target table and obtains a desirable wavelength stably.

In the calibration method in accordance with the embodiment, the discontinuity of gain condition of the laser may be detected with use of front laser light intensity, the gain condition changing of the SOA region 13, detection of sensing current of the SOA region 13, gain condition changing of the SG-DFB region 12 and so on, as in the case of the first embodiment. The method of detecting the discontinuity of the gain condition may be a method of detecting a changing of a differential value of the gain condition.

The calibration method in accordance with the embodiment may be used for a wavelength-tunable laser in which refractive index of the CSG-DBR region 11 is controlled with current. In this case, the current provided to the CSG-DBR region 11 may be controlled and calculated, with the same method of controlling the heater electrical power in the embodiment.

Although the calibration method in accordance with the embodiment is with respect to the laser device illustrated in FIG. 19, the calibration method is performed with respect to the laser devices in accordance with the second embodiment and the third embodiment.

Only one of the $Pa_{Heater\text{-}High}$ through $Pc_{Heater\text{-}High}$ and the $Pa_{Heater\text{-}Low}$ through $Pc_{Heater\text{-}Low}$ may be obtained and accurate setting value may be calculated based on the values, if the terrace range (the range A in FIG. 1) of the wavelength-tunable laser is known in advance.

The temperature of the heaters, to which the $Pa_{Heater\text{-}x}$ through $Pc_{Heater\text{-}x}$ obtained with the above-mentioned calibration method is provided, is generally different from that of the heaters to which the initial electrical power is provided. It is effective that the wavelength is corrected in a case where the oscillation wavelength changes greatly when the $Pa_{Heater\text{-}x}$ through $Pc_{Heater\text{-}x}$ is provided, compared to a case where the initial electrical power is provided.

The calibration device 200 controls the electrical power to the $Pa_{Heater\text{-}x}$ through $Pc_{Heater\text{-}x}$ and operates the laser unit 300, and detects output wavelength with a wavelength meter. The calibration device 200 corrects the temperature $T_{LD}$, obtains a target wavelength, and stores the temperature of the temperature control device 20 at the time in the outer memory 152 as a temperature $T_{LD\text{-}X}$. The optimal target table is generated. In this case, the optimal target includes the temperature $T_{LD\text{-}X}$ in addition to the optical target values of the heaters 14$a$ through 14$c$.

The present invention is not limited to the specifically disclosed embodiments, but include other embodiments and variations without departing from the scope of the present invention.

The present application is based on Japanese Patent Application No. 2007-339196 filed on Dec. 28, 2007 and Japanese Patent Application No. 2008-308984 filed on Dec. 3, 2008, the entire disclosure of which is hereby incorporated by reference.

What is claimed is:

1. A testing method of a wavelength-tunable laser having a resonator including wavelength selection portions having wavelength property different from each other, comprising:

a first step of controlling the wavelength-tunable laser so as to oscillate at a given wavelength according to an initial setting value;

a second step of tuning the wavelength property of the wavelength selection portions and detecting discontinuity points of gain-condition-changing of the wavelength-tunable laser; and a third step of obtaining a stable operating point of the wavelength selection portions according to two limiting points of an oscillation condition at the given wavelength that are adjacent to each other, the limiting point being a point when the discontinuity point is detected.

2. The method as claimed in claim 1, wherein the oscillation condition of the wavelength-tunable laser has discontinuous characteristics with respect to the changing of the wavelength property of the wavelength selection portion.

3. The method as claimed in claim 1, wherein the discontinuity point is detected based on detection of discontinuous changing of intensity of an emitting light of the wavelength-tunable laser, or voltage or current provided to a gain region of the wavelength-tunable laser, in the second step.

4. The method as claimed in claim 1, wherein the wavelength selection portions select wavelength with vernier effect.

5. The method as claimed in claim 1, wherein:

the wavelength-tunable laser has a semiconductor optical amplifier out of the resonator; and the discontinuity point is detected by detecting an optical current of the semiconductor optical amplifier when the semiconductor optical amplifier is biased so as to absorb light, in the second step.

6. The method as claimed in claim 1, wherein the discontinuity point is detected based on differential value of the changing of the gain condition.

7. A controlling method of a wavelength-tunable laser having a resonator including wavelength selection portions having wavelength property different from each other, comprising:

a first step of controlling the wavelength-tunable laser so as to oscillate at a given wavelength according to an initial setting value;

a second step of tuning the wavelength property of the wavelength selection portions and detecting discontinuity points of gain-condition-changing of the wavelength-tunable laser;

a third step of obtaining a stable operating point of the wavelength selection portions according to two limiting points of an oscillation condition at the given wavelength that are adjacent to each other, the limiting point being a point when the discontinuity point is detected; and controlling the wavelength-tunable laser so as to oscillate at the stable operating point obtained in the third step as a target value.

8. A laser device comprising:

a wavelength-tunable laser having a resonator including wavelength selection portions having wavelength property different from each other;

a discontinuity-point detector that controls the wavelength-tunable laser so as to oscillate at a given wavelength according to an initial setting value, tunes the wavelength property of the wavelength selection portions, and detects discontinuity points of gain condition changing of the wavelength-tunable laser;

an operating-point calculator that obtains a stable operating point of the wavelength selection portions according to two limiting points of an oscillation condition at the given wavelength that are adjacent to each other, the limiting point being a point when the discontinuity point is detected; and a controller that controls the wavelength-tunable laser so as to oscillate at the stable operating point obtained in the third step as a target value.

* * * * *